United States Patent
Wada et al.

(10) Patent No.: US 9,490,319 B2
(45) Date of Patent: Nov. 8, 2016

(54) SILICON CARBIDE SEMICONDUCTOR DEVICE

(71) Applicant: Sumitomo Electric Industries, Ltd., Osaka-shi (JP)

(72) Inventors: Keiji Wada, Osaka (JP); Yu Saitoh, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/764,954

(22) PCT Filed: Feb. 4, 2014

(86) PCT No.: PCT/JP2014/052541
§ 371 (c)(1),
(2) Date: Jul. 30, 2015

(87) PCT Pub. No.: WO2014/148129
PCT Pub. Date: Sep. 25, 2014

(65) Prior Publication Data
US 2015/0380485 A1 Dec. 31, 2015

(30) Foreign Application Priority Data
Mar. 21, 2013 (JP) .................................. 2013-058277

(51) Int. Cl.
*H01L 29/78* (2006.01)
*H01L 29/06* (2006.01)
(Continued)

(52) U.S. Cl.
CPC ......... *H01L 29/0661* (2013.01); *H01L 29/045* (2013.01); *H01L 29/0623* (2013.01);
(Continued)

(58) Field of Classification Search
CPC ............. H01L 29/045; H01L 29/1608; H01L 29/66068
See application file for complete search history.

(56) References Cited

U.S. PATENT DOCUMENTS

| 5,719,409 | A | * | 2/1998 | Singh .................. H01L 29/1095 257/328 |
| 5,895,939 | A | | 4/1999 | Ueno |
| 5,963,807 | A | | 10/1999 | Ueno |
| 6,037,632 | A | | 3/2000 | Omura et al. |
| 2008/0230787 | A1 | | 9/2008 | Suzuki et al. |

(Continued)

FOREIGN PATENT DOCUMENTS

| JP | 9-036359 A | 2/1997 |
| JP | 9-191109 A | 7/1997 |

(Continued)

OTHER PUBLICATIONS

International Search Report in International Application No. PCT/JP2014/052541 dated Apr. 28, 2014.

*Primary Examiner* — Daniel Shook
(74) *Attorney, Agent, or Firm* — Venable LLP; Michael A. Sartori; Laura G. Remus

(57) ABSTRACT

The trench has, in a cross-sectional view, a first corner portion which is an intersection between a first sidewall surface and a bottom portion and a second corner portion which is an intersection between a second sidewall surface and the bottom portion. A first layer has a second-conductivity-type region. In a cross-sectional view, the second-conductivity-type region is arranged to intersect with a line which passes through any of the first corner portion and the second corner portion and is in parallel to a <0001> direction of a silicon carbide crystal forming the silicon carbide layer. A ratio calculated by dividing SP by ST is not lower than 20% and not higher than 130%, where ST represents a total area of the trenches in a boundary surface between the first layer and a second layer and SP represents a total area of the second-conductivity-type regions in a plan view.

10 Claims, 17 Drawing Sheets

(51) Int. Cl.
*H01L 29/66* (2006.01)
*H01L 29/04* (2006.01)
*H01L 29/16* (2006.01)
*H01L 29/08* (2006.01)
*H01L 29/739* (2006.01)

(52) U.S. Cl.
CPC ....... *H01L29/0696* (2013.01); *H01L 29/0878* (2013.01); *H01L 29/1608* (2013.01); *H01L 29/66068* (2013.01); *H01L 29/78* (2013.01); *H01L 29/7397* (2013.01)

(56) References Cited

U.S. PATENT DOCUMENTS

2009/0166730 A1    7/2009  Okuno et al.
2012/0326166 A1*  12/2012  Masuda ................ H01L 21/049
                                                                         257/77

FOREIGN PATENT DOCUMENTS

| JP | 2008-235546 A | 10/2008 |
| JP | 2009-158681 A | 7/2009 |
| JP | 2013-008890 A | 1/2013 |
| WO | WO-2008/015764 A1 | 2/2008 |

* cited by examiner

SILICON CARBIDE SEMICONDUCTOR DEVICE

TECHNICAL FIELD

This invention relates to a silicon carbide semiconductor device and particularly to a silicon carbide semiconductor device provided with a trench.

BACKGROUND ART

In an Si (silicon) MOSFET (Metal Oxide Semiconductor Field Effect Transistor) representing a widely used power semiconductor device, a main factor determining a breakdown voltage is an upper limit of electric field intensity which a drift layer forming a breakdown voltage holding region can withstand. A drift layer made of Si may break down at a portion where electric field not lower than approximately 0.3 MV/cm is applied. Therefore, it is necessary to suppress electric field intensity to be less than a prescribed value in the entire drift layer of a MOSFET. The simplest method is to lower an impurity concentration in a drift layer and to increase a thickness of the layer. This method, however, is disadvantageous in high ON resistance of a MOSFET. Namely, there is trade-off relation between ON resistance and a breakdown voltage.

Japanese Patent Laying-Open No. 9-191109 (PTD 1) describes trade-off relation between ON resistance and a breakdown voltage in connection with a typical Si MOSFET, taking into consideration a theoretical limit obtained from a physical property value of Si. Then, in order to overcome this trade-off, it has disclosed addition of a lower p-type embedded layer and an upper p-type embedded layer in an n base layer on an n-type substrate on a drain electrode. The lower p-type embedded layer and the upper embedded layer divide the n base layer into a lower portion, a middle portion, and an upper portion equal to one another in thickness. According to this document, an equally divided voltage is applied to the three portions and maximum electric field of each portion is kept at limit electric field intensity or lower.

CITATION LIST

Patent Document

PTD 1: Japanese Patent Laying-Open No. 9-191109

SUMMARY OF INVENTION

Technical Problem

As a method for greatly improving the trade-off described above, use of SiC (silicon carbide) instead of Si has actively been discussed in recent years. Unlike Si, SiC is a material which can sufficiently withstand even electric field intensity not lower than 0.4 MV/cm.

In a case where such high electric field may be applied, breakdown due to electric field concentration at a specific position in a MOSFET structure gives rise to a problem. For example, in a case of a trench-structure MOSFET, a breakdown phenomenon of a gate insulating film due to electric field concentration in the gate insulating film at a bottom portion, in particular a corner portion, of a trench is a main factor determining a breakdown voltage. Thus, a factor determining a breakdown voltage is different between an Si semiconductor device and an SiC semiconductor device. Therefore, if the technique in the document above which is considered to be premised on use of Si is simply applied for improvement of a breakdown voltage of an SiC semiconductor device, improvement in breakdown voltage by making full use of advantages in terms of physical properties of SiC cannot be achieved.

A silicon carbide substrate included in a silicon carbide semiconductor device includes dislocation such as threading screw dislocation. When a trench is formed in a silicon carbide substrate including the dislocation, variation in quality or thickness of a gate insulating film at a corner portion of the trench becomes significant, and consequently, a difference between a portion where the gate insulating film is less likely to break and a portion where the gate insulating film is likely to break becomes greater. Consequently, a breakdown voltage of the silicon carbide semiconductor device is lowered.

The present invention was made to solve the problems as described above, and an object of this invention is to provide a silicon carbide semiconductor device capable of achieving suppressed lowering in breakdown voltage.

Solution to Problem

The inventors have conducted dedicated studies about a method of suppressing lowering in breakdown voltage of a silicon carbide semiconductor device, and found that electric field at a corner portion of a trench can effectively be relaxed by providing a p-type region (a second-conductivity-type region) at a position intersecting with a line which passes through a corner portion of a trench and is in parallel to a <0001> direction (that is, a direction of a c axis) of a silicon carbide crystal, around a bottom portion of the trench. Consequently, lowering in breakdown voltage of the silicon carbide semiconductor device can be suppressed.

A silicon carbide semiconductor device according to the present invention includes a silicon carbide layer. The silicon carbide layer has a first main surface and a second main surface opposite to the first main surface. The silicon carbide layer includes a first layer forming the first main surface and having a first conductivity type, a second layer provided on the first layer and having a second conductivity type different from the first conductivity type, and a third layer provided on the second layer to be spaced apart from the first layer, forming the second main surface, and having the first conductivity type. The second main surface of the silicon carbide layer is provided with a trench. The trench has a sidewall surface passing through the third layer and the second layer to reach the first layer and a bottom portion located in the first layer. The sidewall surface has a first sidewall surface and a second sidewall surface which are opposed to each other in a cross-sectional view. The trench further has, in a cross-sectional view, a first corner portion which is an intersection between the first sidewall surface and the bottom portion and a second corner portion which is an intersection between the second sidewall surface and the bottom portion. The first layer has a second-conductivity-type region located on a side of the first main surface relative to the bottom portion and having the second conductivity type.

In a cross-sectional view, the second-conductivity-type region is arranged to intersect with a line which passes through any of the first corner portion and the second corner portion and is in parallel to a <0001> direction of a silicon carbide crystal forming the silicon carbide layer. A ratio calculated by dividing SP by ST is not lower than 20% and not higher than 130%, where ST represents a total area of the trenches in a boundary surface between the first layer and the second layer and SP represents a total area of the second-conductivity-type regions in a plan view.

Advantageous Effects of Invention

As described above, according to the present invention, lowering in breakdown voltage of a silicon carbide semiconductor device can be suppressed.

DESCRIPTION OF EMBODIMENTS

Figure 1:
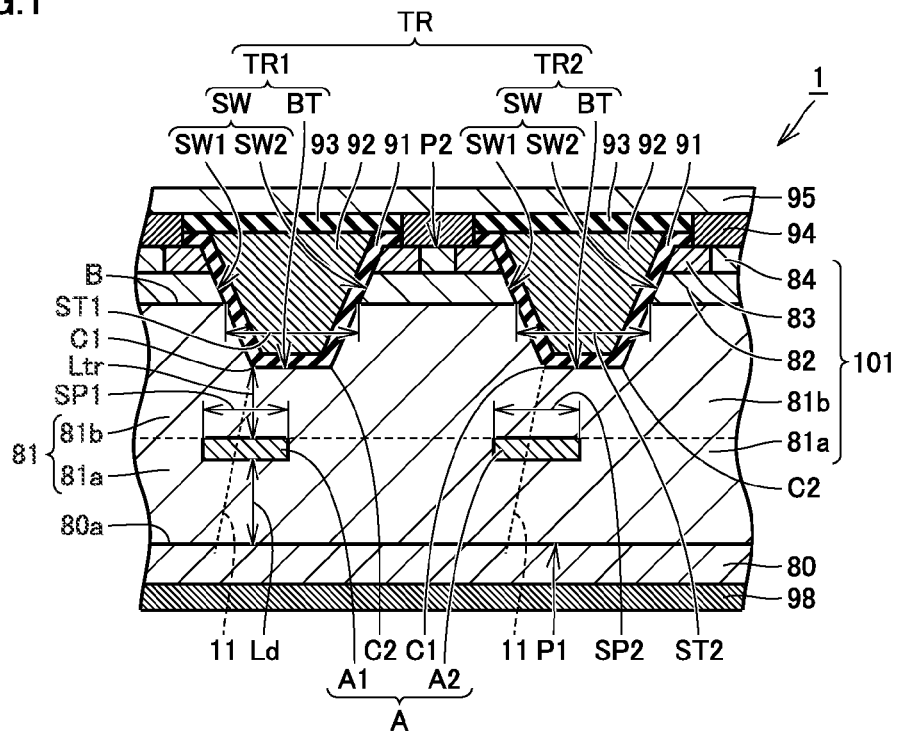
FIG. 1 is a partial cross-sectional view schematically showing a construction of a silicon carbide semiconductor device according to a first embodiment of the present invention.

An embodiment of the present invention will be described hereinafter with reference to the drawings. It is noted that, in the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ), and { }, respectively. Moreover, a crystallographically negative index is normally expressed by a number with a bar "-" thereabove, however, a negative sign herein precedes a number.

Overview of an embodiment will initially be described in (i) to (x) below.

(i) A silicon carbide semiconductor device 1 according to the present embodiment has a silicon carbide layer 101. Silicon carbide layer 101 has a first main surface P1 and a second main surface P2 opposite to first main surface P1. Silicon carbide layer 101 includes a first layer 81 forming first main surface P1 and having a first conductivity type, a second layer 82 provided on first layer 81 and having a second conductivity type different from the first conductivity type, and a third layer 83 provided on second layer 82 to be spaced apart from first layer 81, forming second main surface P2, and having the first conductivity type. Second main surface P2 of silicon carbide layer 101 is provided with a trench TR.

Trench TR has a sidewall surface SW passing through third layer 83 and second layer 82 to reach first layer 81 and a bottom portion BT located in first layer 81. Sidewall surface SW has a first sidewall surface SW1 and a second sidewall surface SW2 which are opposed to each other in a cross-sectional view. Trench TR further has, in a cross-sectional view, a first corner portion C1 which is an intersection between first sidewall surface SW1 and bottom portion BT and a second corner portion C2 which is an intersection between second sidewall surface SW2 and bottom portion BT. First layer 81 has a second-conductivity-type region A located on a side of first main surface P1 relative to bottom portion BT and having the second conductivity type.

In a cross-sectional view, second-conductivity-type region A is arranged to intersect with a line 11 which passes through any of first corner portion C1 and second corner portion C2 and is in parallel to a <0001> direction of a silicon carbide crystal forming silicon carbide layer 101. A ratio calculated by dividing SP by ST is not lower than 20% and not higher than 130%, where ST represents a total area of trenches TR in a boundary surface B between first layer 81 and second layer 82 and SP represents a total area of the second-conductivity-type regions in a plan view.

According to the silicon carbide semiconductor device in the present embodiment, in a cross-sectional view, second-conductivity-type region A is arranged to intersect with the line which passes through any of first corner portion C1 and second corner portion C2 and is in parallel to the <0001> direction of the silicon carbide crystal forming silicon carbide layer 101. Thus, electric field in first corner portion C1 or second corner portion C2 of trench TR can effectively be relaxed. Consequently, lowering in breakdown voltage of silicon carbide semiconductor device 1 can be suppressed. When a ratio calculated by dividing total area SP of the second-conductivity-type regions by total area ST of the trenches is not lower than 20%, lowering in breakdown voltage of the silicon carbide semiconductor device due to influence by dislocation can be suppressed. Furthermore, when a ratio calculated by dividing total area SP of the second-conductivity-type regions by total area ST of the trenches is not higher than 130%, increase in ON resistance of the silicon carbide semiconductor device can be suppressed.

(ii) In the silicon carbide semiconductor device according to the present embodiment, preferably, a distance L between second-conductivity-type region A and bottom portion BT of trench TR is not greater than 4 μm. Thus, electric field concentration in a gate insulating film 91 at bottom portion BT of trench TR can more effectively be suppressed. Therefore, lowering in breakdown voltage of silicon carbide semiconductor device 1 can effectively be suppressed.

(iii) In the silicon carbide semiconductor device according to the present embodiment, preferably, a distance $L_d$ between second-conductivity-type region A and first main surface P1 is not smaller than 5 μm. Thus, a depletion layer having a length of 5 μm at the maximum can be formed between second-conductivity-type region A and first main surface P1. In other words, a depletion layer having a sufficient length can more reliably be formed between second-conductivity-type region A and first main surface P1. Therefore, lowering in breakdown voltage of silicon carbide semiconductor device 1 can effectively be suppressed.

(iv) The silicon carbide semiconductor device according to the present embodiment preferably further has a silicon carbide single-crystal substrate 80 in contact with first main surface P1. Thus, silicon carbide semiconductor device 1 having silicon carbide single-crystal substrate 80 can be obtained.

(v) In the silicon carbide semiconductor device according to the present embodiment, preferably, a dislocation density of a surface 80a of silicon carbide single-crystal substrate 80 in contact with first main surface P1 is not less than 50/cm$^2$ and not more than 5000/cm$^2$. When a dislocation density of surface 80a in contact with first main surface P1 is in a range not less than 50/cm$^2$ and not more than 5000/cm$^2$, lowering in breakdown voltage of silicon carbide semiconductor device 1 can more effectively be suppressed.

(vi) In the silicon carbide semiconductor device according to the present embodiment, preferably, surface 80a of silicon carbide single-crystal substrate 80 in contact with first main surface P1 has an off angle not smaller than 2° and not greater than 8° with respect to a {000-1} plane. Since surface 80a in contact with first main surface P1 has an off angle not smaller than 2° and not greater than 8° with respect to the {000-1} plane, lowering in breakdown voltage of silicon carbide semiconductor device 1 can more effectively be suppressed.

(vii) In the silicon carbide semiconductor device according to the present embodiment, preferably, on sidewall surface SW of trench TR, second layer 82 is provided with a surface SW including a first surface S1 having a plane orientation {0-33-8}. Thus, a channel resistance at sidewall surface SW can be lowered. Therefore, an ON resistance can be lowered.

(viii) In the silicon carbide semiconductor device according to the present embodiment, preferably, surface SW microscopically includes first surface S1 and surface SW microscopically further includes a second surface S2 having a plane orientation {0-11-1}. Thus, a channel resistance at sidewall surface SW can be lowered. Therefore, an ON resistance can be lowered.

(ix) In the silicon carbide semiconductor device according to the present embodiment, preferably, the first and second surfaces of surface SW form a combined surface SR having a plane orientation {0-11-2}. Thus, a channel resistance at sidewall surface SW can be lowered. Therefore, an ON resistance can be lowered.

(x) In the silicon carbide semiconductor device according to the present embodiment, preferably, surface SW has an off angle of 62°±10° macroscopically with respect to a {000-1} plane. Thus, a channel resistance at sidewall surface SW can be lowered. Therefore, an ON resistance can be lowered.

An embodiment of the present invention will be described below in further detail.

Figure 2:
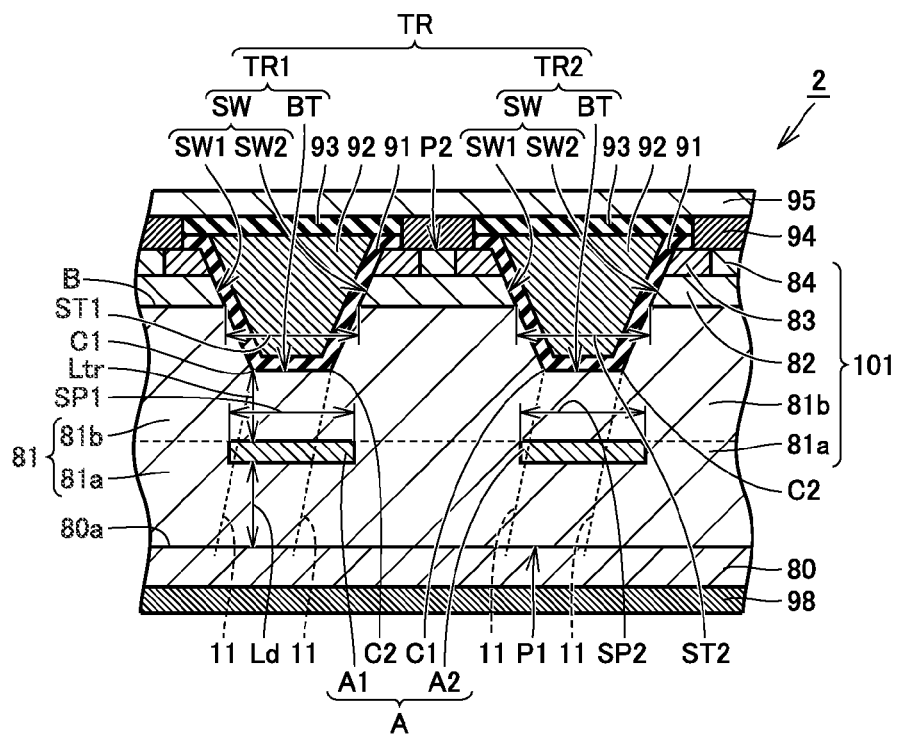
FIG. 2 is a partial cross-sectional view schematically showing a construction of a variation of a silicon carbide semiconductor device according to one embodiment of the present invention.
Figure 3:
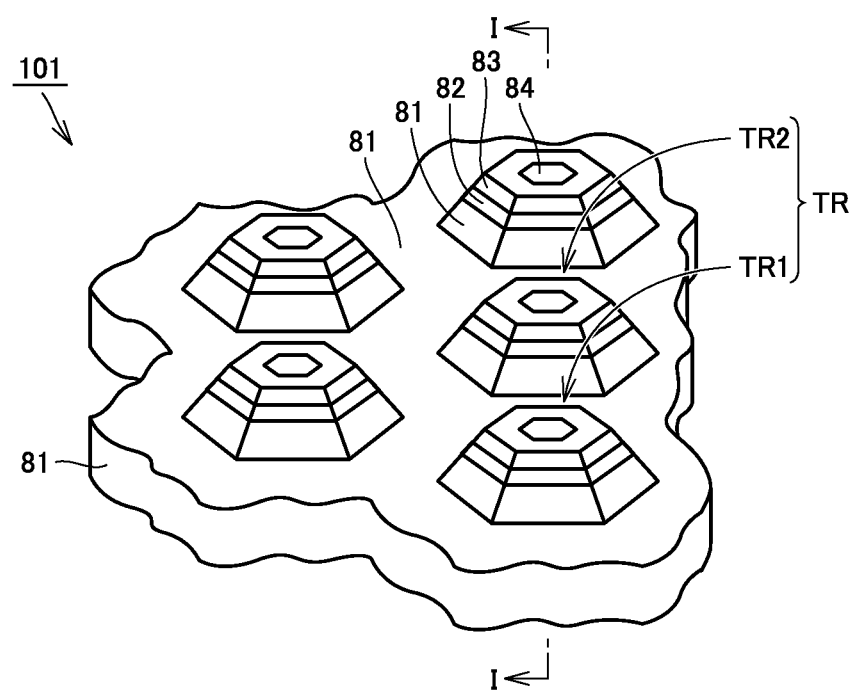
FIG. 3 is a partial perspective view schematically showing a shape of a silicon carbide layer of the silicon carbide semiconductor device in FIGS. 1 and 2.

As shown in FIGS. 1 to 3, a MOSFET 1 as a silicon carbide semiconductor device in the present embodiment has silicon carbide single-crystal substrate 80, an epitaxial layer 101 (a silicon carbide layer), gate insulating film 91 (gate oxide film), a gate electrode 92, an interlayer insulating film 93, a source electrode 94, a source interconnection layer 95, and a drain electrode 98 MOSFET 1 preferably has a breakdown voltage not lower than 600 V across drain electrode 98 and source electrode 94. In other words, MOSFET 2 is preferably a power semiconductor device having a high breakdown voltage.

Epitaxial layer 101 is a silicon carbide layer epitaxially grown on silicon carbide single-crystal substrate 80. Epitaxial layer 101 has hexagonal crystal structure having a poly type of 4H. Epitaxial layer 101 has a lower surface P1 (a first main surface) facing silicon carbide single-crystal substrate 80 and an upper surface P2 (a second main surface) opposite to lower surface P1. Epitaxial layer 101 has an n drift layer 81 (a drift layer), a p body layer 82 (a body region), an n region 83 (a source region), a p contact region 84, and p-type region A.

N drift layer 81 has an n-type (a first conductivity type). N drift layer 81 (a first layer) has a lower drift layer 81a and an upper drift layer 81b. Lower drift layer 81a forms lower surface P1 of epitaxial layer 101. P-type region A is partially provided in a surface of lower drift layer 81a, opposite to lower surface P1. Upper drift layer 81b is provided on the surface of lower drift layer 81a opposite to lower surface P1. Thus, upper drift layer 81b covers p-type region A. An impurity concentration in n drift layer 81 is preferably lower than an impurity concentration in silicon carbide single-crystal substrate 80. A donor concentration in n drift layer 81 is preferably not lower than $1 \times 10^{15}$ cm$^{-3}$ and not higher than $5 \times 10^{16}$ cm$^{-3}$ and it is set, for example, to $8 \times 10^{15}$ cm$^{-3}$. Preferably, an impurity concentration in lower drift layer 81a is equal to or lower than an impurity concentration in upper drift layer 81b and more preferably lower than the impurity concentration in upper drift layer 81b. Impurity concentrations in lower drift layer 81a and upper drift layer 81b are set, for example, to $4.0 \times 10^{15}$ cm$^{-3}$ and $7.5 \times 10^{15}$ cm$^{-3}$, respectively. Lower drift layer 81a and upper drift layer 81b have thicknesses, for example, of 12 μm and 3 μm, respectively.

P body layer 82 (a second layer) has a p-type (a second conductivity type). P body layer 82 is provided on upper drift layer 81b. An impurity concentration in p body layer 82 is preferably not lower than $1 \times 10^{17}$ cm$^{-3}$ and not higher than $5 \times 10^{18}$ cm$^{-3}$ and it is set, for example, to $1 \times 10^{18}$ cm$^{-3}$.

N region 83 (a third layer) has the n-type. N region 83 is provided on p body layer 82 to be spaced apart from n drift layer 81 by p body layer 82. N region 83 forms upper surface P2 of epitaxial layer 101, together with p contact region 84. P contact region 84 has the p-type. P contact region 84 is connected to p body layer 82.

Trench TR is provided in upper surface P2 of epitaxial layer 101. Trench TR has sidewall surface SW and bottom portion BT. Sidewall surface SW passes through n region 83 and p body layer 82 to reach upper drift layer 81b. Sidewall surface SW includes a channel surface of MOSFET 1 on p body layer 82. Sidewall surface SW has first sidewall surface SW1 and second sidewall surface SW2 which are opposed to each other in a cross-sectional view (in other words, a field of view from a direction in parallel to second main surface P2 or first main surface P1). Preferably, first sidewall surface SW1 and second sidewall surface SW2 are line symmetric with respect to a normal of second main surface P2 and first main surface P1.

Sidewall surface SW is inclined with respect to upper surface P2 of epitaxial layer 101, so that trench TR expands in a tapered shape toward an opening. A plane orientation of sidewall surface SW is inclined preferably by not smaller than 50° and not greater than 65° with respect to a {000-1} plane and more preferably inclined by not smaller than 50° and not greater than 65° with respect to a (000-1) plane. Preferably, sidewall surface SW has a prescribed crystal plane (also referred to as a special surface) in particular in a portion on p body layer 82. Details of the special surface will be described later.

Bottom portion BT is located on upper drift layer 81b. In the present embodiment, bottom portion BT has a flat shape substantially in parallel to upper surface P2. A portion where bottom portion BT and sidewall surface SW are connected to each other forms a corner portion of trench TR. More specifically, trench TR has, in a cross-sectional view, first corner portion C1 which is an intersection between first sidewall surface SW1 and bottom portion BT and second corner portion C2 which is an intersection between second sidewall surface SW2 and the bottom portion.

P-type region A (the second-conductivity-type region) is an electric field relaxing region and has the p-type. P-type region A is provided within n drift layer 81. N drift layer 81 has p-type region A located on a side of first main surface P1 relative to bottom portion BT of trench TR. In a cross-sectional view, p-type region A is arranged to intersect with line 11 which passes through any of first corner portion C1 and second corner portion C2 of trench TR and is in parallel to the <0001> direction of a hexagonal silicon carbide crystal forming silicon carbide layer 101. Alternatively, as shown in FIG. 2, p-type region A may be arranged to intersect with line 11 which passes through first corner portion C1 of trench TR and is in parallel to the <0001> direction of a hexagonal silicon carbide crystal forming silicon carbide layer 101 and further to intersect with line 11 which passes through first corner portion C1 of trench TR and is in parallel to the <0001> direction of a hexagonal silicon carbide crystal forming silicon carbide layer 101. P-type region A may be arranged to oppose to the entire bottom portion BT of trench TR in a cross-sectional view as shown in FIG. 2, and may be arranged to oppose to a part of bottom portion BT of trench TR in a cross-sectional view as shown in FIG. 1. P-type region A is distant from each of first sidewall surface SW1, second sidewall surface SW2, first corner portion C1, second corner portion C2, and bottom portion BT of trench TR.

P-type region A has an impurity dose amount $D_{rx}$. Here, an impurity dose amount in connection with already-formed p-type region A means an impurity concentration per unit area of p-type region A. Preferably, relation of $D_{rx} \geq 1 \times 10^{13}$ cm$^{-2}$ is satisfied. P-type region A has a distance $L_d$ from lower surface P1. Preferably, relation of $L_d \geq 5$ μm is satisfied. N drift layer 81 has an impurity concentration $N_d$ between lower surface P1 and p-type region A. In other words, lower drift layer 81a has impurity concentration $N_d$. Relation of $D_{rx} > L_d \cdot N_d$ is satisfied.

Preferably, p-type region A is distant from p body layer 82 by not smaller than 1 μm and not greater than 5 μm. A dose amount in p-type region A is, for example, not less than $1 \times 10^{13}$ cm$^{-2}$ and not more than $1 \times 10^{15}$ cm$^{-2}$ and it is preferably not less than $1 \times 10^{13}$ cm$^{-2}$ and not more than $5 \times 10^{13}$ cm$^{-2}$. An impurity in p-type region A is represented, for example, by aluminum. P-type region A is provided at least partially at a position deeper than a position of bottom portion BT of trench TR.

In MOSFET 1 in the present embodiment, p-type region A is provided at a position deeper than bottom portion BT of trench TR. P-type region A is arranged at least partially outside bottom portion BT of trench TR in a plan view. Distance $L_{tr}$ between p-type region A and bottom portion BT of trench TR is preferably not greater than 4 μm. Specifically, trench TR has a corner portion formed by sidewall surface SW and bottom portion BT and distance $L_{tr}$ between this corner portion and p-type region A is preferably not greater than 4 μm.

Gate insulating film 91 covers each of first sidewall surface SW1, second sidewall surface SW2, and bottom portion BT of trench TR. Thus, gate insulating film 91 is provided on p body layer 82 so as to connect n region 83 and upper drift layer 81b to each other. Gate electrode 92 is provided on gate insulating film 91.

Silicon carbide single-crystal substrate 80 is composed of silicon carbide and has the n-type. Silicon carbide single-crystal substrate 80 is in contact with epitaxial layer 101 (silicon carbide layer). Preferably, surface 80a of silicon carbide single-crystal substrate 80 in contact with first main surface P1 has an off angle not smaller than 2° and not greater than 8° with respect to a {000-1} plane. The off angle may be not smaller than 0.2° and not greater than 8° or may be not smaller than 3.5° and not greater than 4.5°. A dislocation density of surface 80a of silicon carbide single-crystal substrate 80 in contact with first main surface P is preferably not less than $50/cm^2$ and not more than $5000/cm^2$ and more preferably not less than $100/cm^2$ and not more than $1000/cm^2$. Dislocation present at surface 80a of silicon carbide single-crystal substrate 80 includes threading dislocation having a Burgers vector mainly in the <0001> direction. Threading dislocation may be threading screw dislocation or threading edge dislocation. Threading dislocation may be composite dislocation having both components of threading screw dislocation and threading edge dislocation.

Silicon carbide single-crystal substrate 80 is provided between lower surface P of epitaxial layer 101 and drain electrode 98 and comes in contact with each of lower surface P1 of epitaxial layer 101 and drain electrode 98. Silicon carbide single-crystal substrate 80 has an impurity concentration higher than impurity concentration NJ in lower drift layer 81a. Preferably, an impurity concentration in silicon carbide single-crystal substrate 80 is at least 50 times as high as impurity concentration $N_d$ in lower drift layer 81a, and in this case, silicon carbide single-crystal substrate 80 does not substantially have a breakdown voltage holding function.

Source electrode 94 is in contact with each of n region 83 and p contact region 84. Source interconnection layer 95 is in contact with source electrode 94. Source interconnection layer 95 is, for example, an aluminum layer. Interlayer insulating film 93 isolates gate electrode 92 and source interconnection layer 95 from each other.

A shape of trench TR formed in second main surface P2 will be described with reference to FIGS. 3 and 4. Trench TR extends to form a mesh having a honeycomb structure in a plan view (that is, a field of view in a direction perpendicular to second main surface P2 or first main surface P1). Thus, epitaxial layer 101 has upper surface P2 having a hexagonal shape and surrounded by trench TR. N region 83 and p contact region 84 are exposed at upper surface P2.

Figure 4:
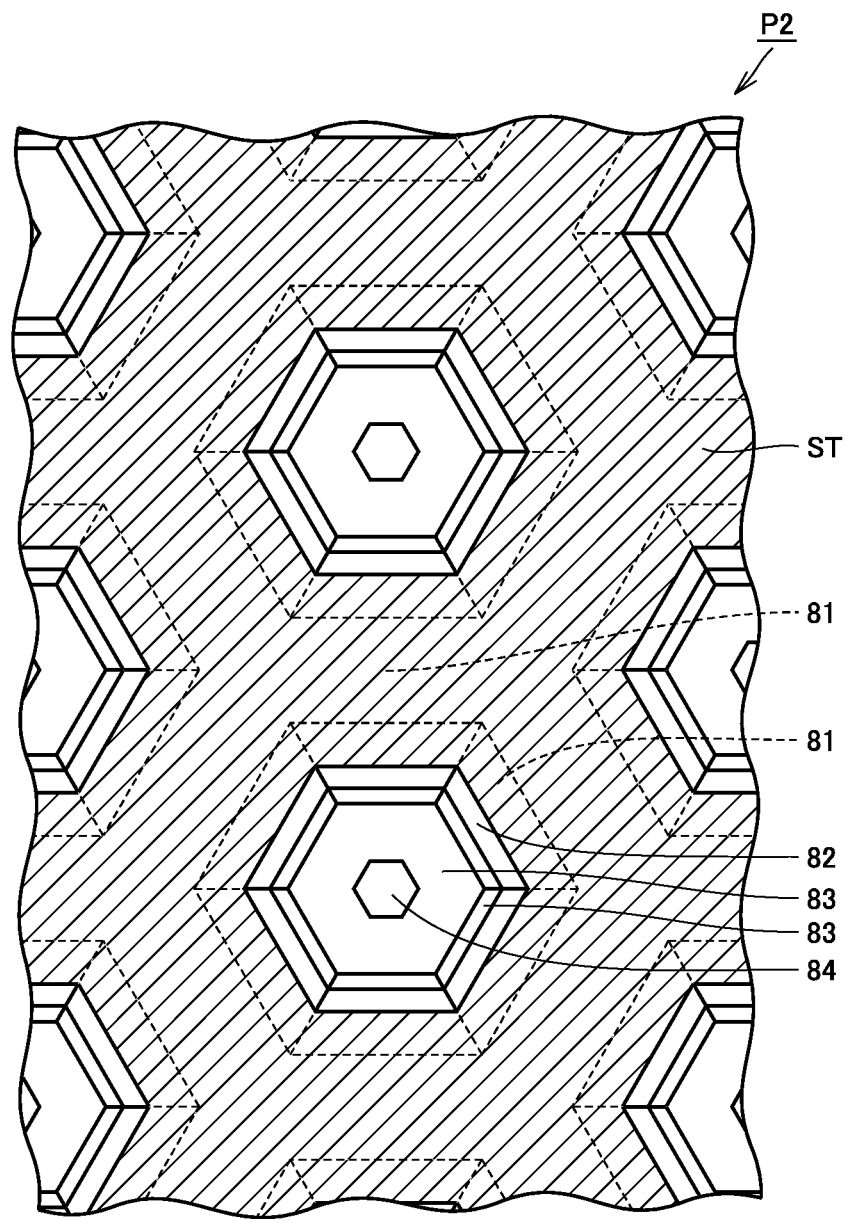
FIG. 4 is a schematic plan view for illustrating a total area ST of trenches in a boundary surface between a first layer and a second layer.

Referring to FIG. 4, it is assumed that ST represents a total area of trenches TR in boundary surface B between n drift layer 81 (the first layer) and p body 82 layer (the second layer) in the plan view. Total area ST of trenches TR represents an area, for example, of a region shown with a hatched line in FIG. 4. Referring to FIG. 1, more specifically, when a first trench portion TR1 and a second trench portion TR2 are provided in second main surface P2, total area ST of trenches in boundary surface B is calculated as ST=ST1+ST2, where ST1 represents an area of first trench portion TR1 in boundary surface B and ST2 represents an area of second trench portion TR in boundary surface B.

Figure 5:
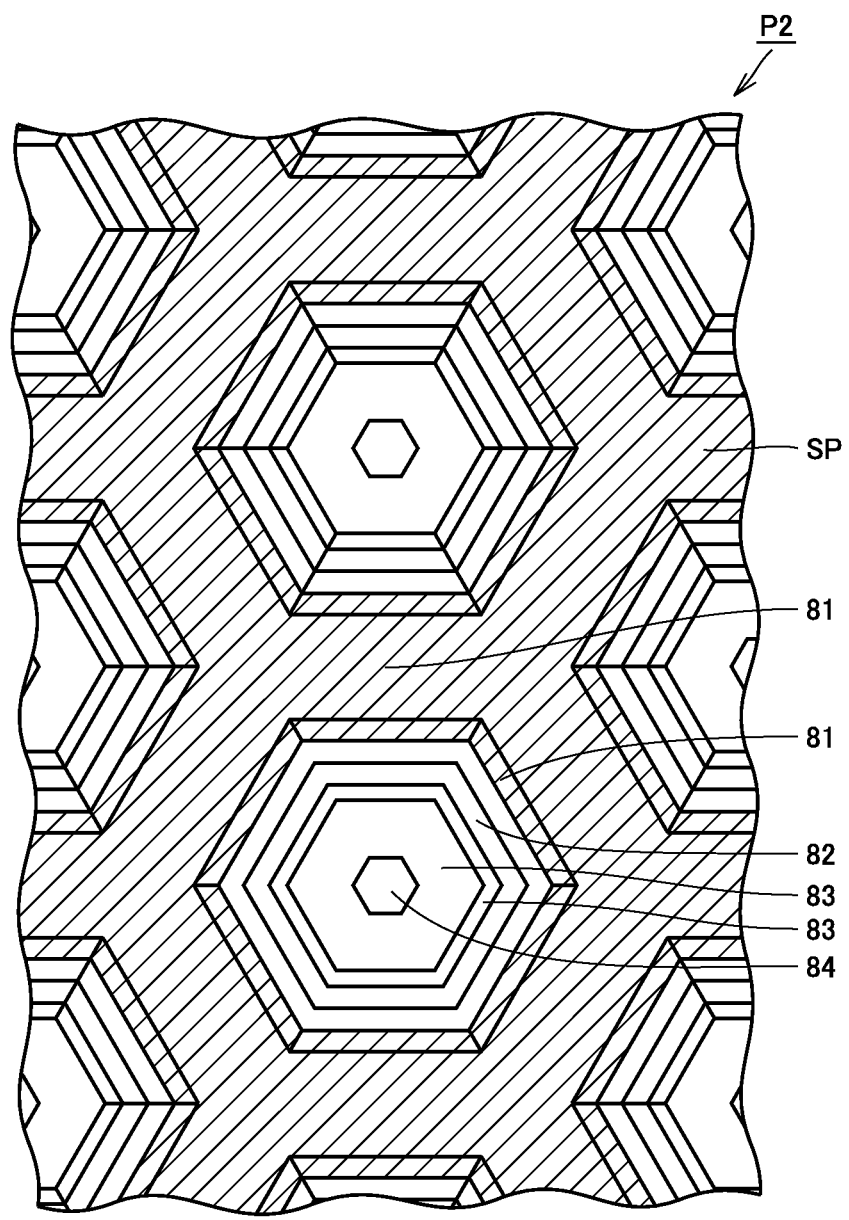
FIG. 5 is a schematic plan view for illustrating a total area SP of second-conductivity-type regions.

For example, as shown in FIG. 2, p-type region A of a MOSFET 2 is arranged to cover the entire bottom portion BT of trench TR. Total area SP of p-type regions A of MOSFET 2 in a plan view represents an area of regions shown with a hatched line in FIG. 5. According to the MOSFET in the present embodiment, total area SP of p-type regions A is greater than total area ST of trenches TR. P-type region A may be implemented by a plurality of regions separate from each other, which may be, for example, in a form of spots, grids, or stripes. P-type region A may have a first p-type region A1 arranged below first trench portion TR1 and a second p-type region A2 arranged below second trench portion TR2. Total area SP of p-type region A is calculated as SP=SP1+SP2, where SP1 represents an area of first p-type region A1 and SP2 represents an area of second p-type region A2 in a plan view. A ratio calculated by dividing total area SP of p-type regions A by total area ST of trenches TR is not lower than 20% and not higher than 130%, where ST represents a total area of trenches TR in boundary surface B between n drift layer 81 and p body layer 82 and SP represents a total area of p-type regions A in a plan view. The ratio is preferably not lower than 30% and not higher than 120% and more preferably not lower than 30% and not higher than 90%. For example, when a plurality of trench portions are provided in second main surface P2 in a cross-sectional view, p-type region A may be provided at a position opposed to bottom portion BT of one trench portion and p-type region A may not be provided at a position opposed to bottom portion BT of another trench portion.

Figure 6:
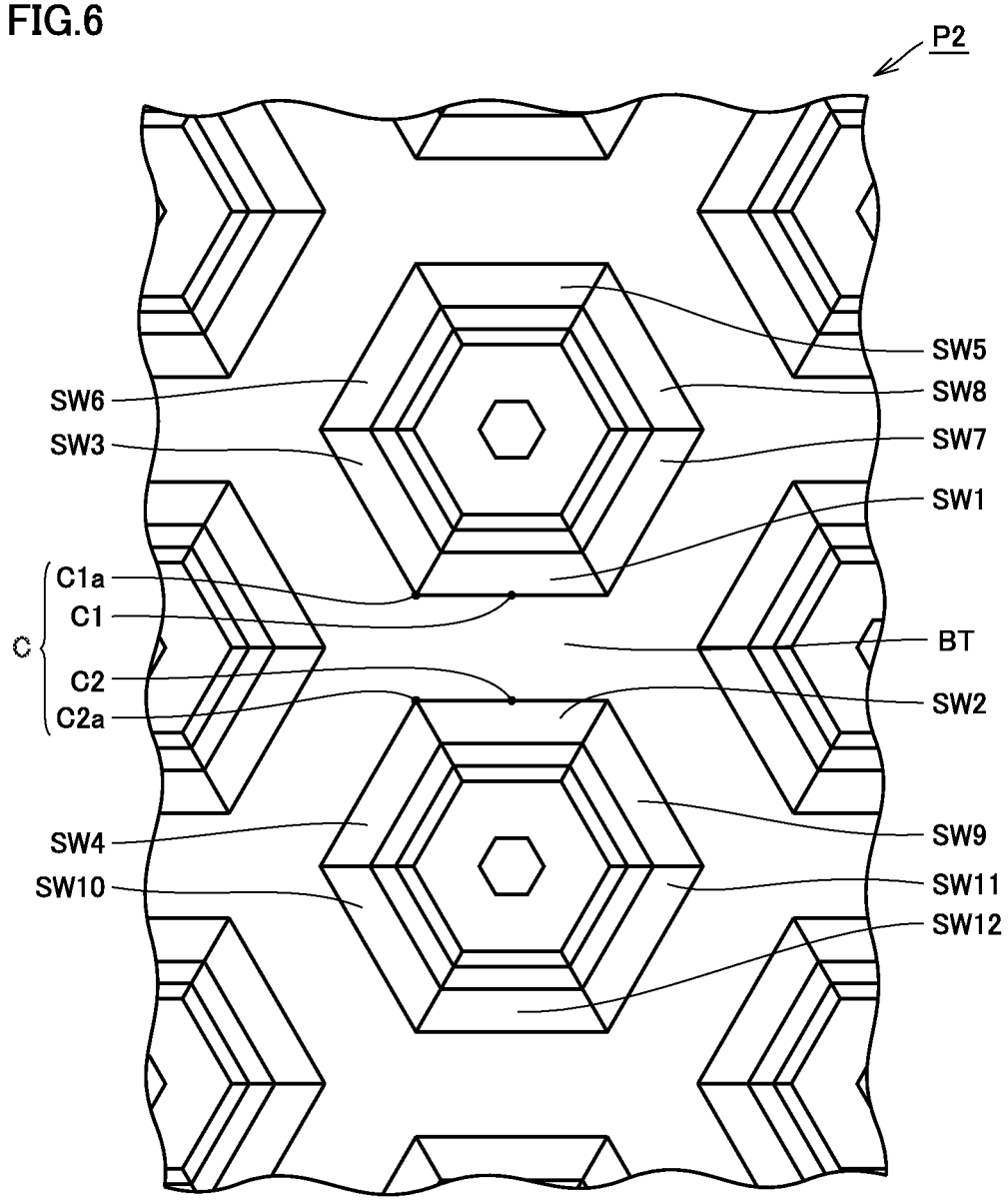
FIG. 6 is a schematic plan view for illustrating a corner portion of a trench.

Referring to FIG. 6, corner portion C of trench TR in MOSFET 1 in the present embodiment has a hexagonal (polygonal) shape in a plan view. First corner portion C1 of trench TR may be located on a side or a vertex of the hexagon in a plan view. Trench TR may have a third sidewall surface SW3 adjacent to first sidewall surface SW1 in a plan view. Preferably, first corner portion C1 of trench TR is a point of contact C1a among first sidewall surface SW1, third sidewall surface SW3, and bottom portion BT. Similarly, second corner portion C2 of trench TR may be located on a side or a vertex of the hexagon in a plan view. Trench TR may have a fourth sidewall surface SW4 adjacent to second sidewall surface SW2 in a plan view. Preferably, first corner portion C1 of trench TR is a point of contact C2a among second sidewall surface SW2, fourth sidewall surface SW4, and bottom portion BT.

(Special Surface)

Figure 7:
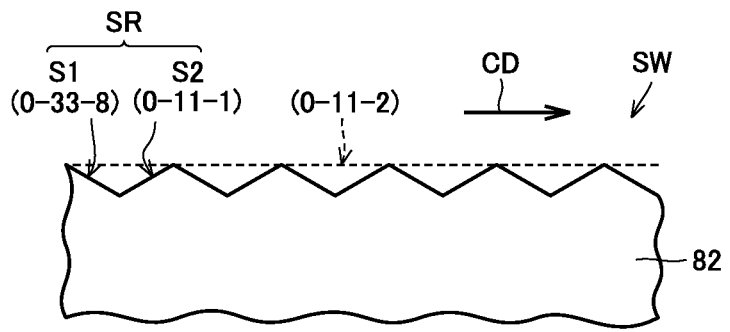
FIG. 7 is a partial cross-sectional view schematically showing a microstructure at a surface of a silicon carbide layer in a silicon carbide semiconductor device.

Sidewall surface SW described above has a special surface in particular in a portion on p body layer 82. Sidewall surface SW having the special surface includes a surface S1 (a first surface) having a plane orientation {0-33-8} as shown in FIG. 7. In other words, on sidewall surface SW of trench TR, p body layer 82 is provided with a surface including surface S1. Surface S1 preferably has a plane orientation (0-33-8).

More preferably, sidewall surface SW microscopically includes surface S1, and sidewall surface SW microscopically further includes a surface S2 (a second surface) having a plane orientation {0-11-1}. Here, "microscopic" means in detail to such an extent that a dimension about twice as large as interatomic spacing is at least taken into consideration. As a method of observing such a microscopic structure, for example, TEM (Transmission Electron Microscope) can be employed. Surface S2 preferably has a plane orientation (0-11-1).

Preferably, surface S1 and surface S2 of sidewall surface SW form combined surface SR having a plane orientation {0-11-2}. Namely, combined surface SR is formed by periodic repetition of surfaces S1 and S2. Such a periodic structure can be observed, for example, with TEM or AFM (Atomic Force Microscopy). In this case, combined surface SR has an off angle of 62° macroscopically with respect to the {000-1} plane. Here, "macroscopic" means ignoring a microstructure having a dimension as small as interatomic spacing. For measuring such a macroscopic off angle, for example, a method with the use of general X-ray diffraction can be employed. Preferably, combined surface SR has a plane orientation (0-11-2). In this case, combined surface SR has an OFF angle of 62° macroscopically with respect to a (000-1) plane.

Preferably, a channel direction CD representing a direction in which carriers flow over a channel surface (that is, a direction of thickness of a MOSFET (the vertical direction in FIG. 1 and the like)) extends along a direction in which periodic repetition described above appears.

A detailed structure of combined surface SR will now be described.

Figure 8:
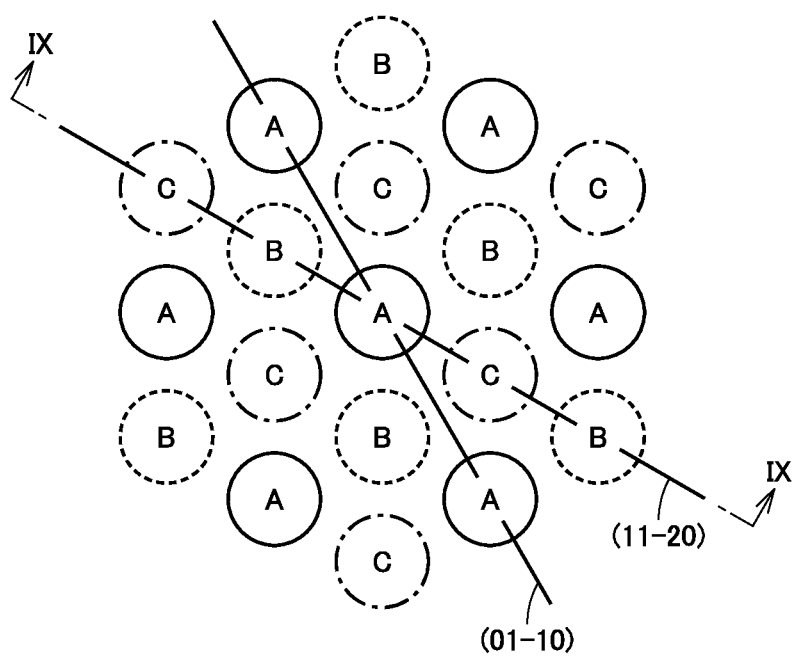
FIG. 8 is a diagram showing crystal structure at a (000-1) plane in a hexagonal crystal having a poly type of 4H.

In general, when silicon carbide single crystal of a poly type of 4H is viewed from the (000-1) plane, as shown in FIG. 8, Si atoms (or C atoms) are provided such that atoms in an A layer (a solid line in the figure), atoms in a B layer located thereunder (a dashed line in the figure), atoms in a C layer located thereunder (a chain dotted line in the figure), and atoms in the B layer located thereunder (not shown) are repeatedly provided. Namely, such a periodic stack structure as ABCBABCBABCB . . . with four layers of ABCB being defined as one period is provided.

Figure 9:
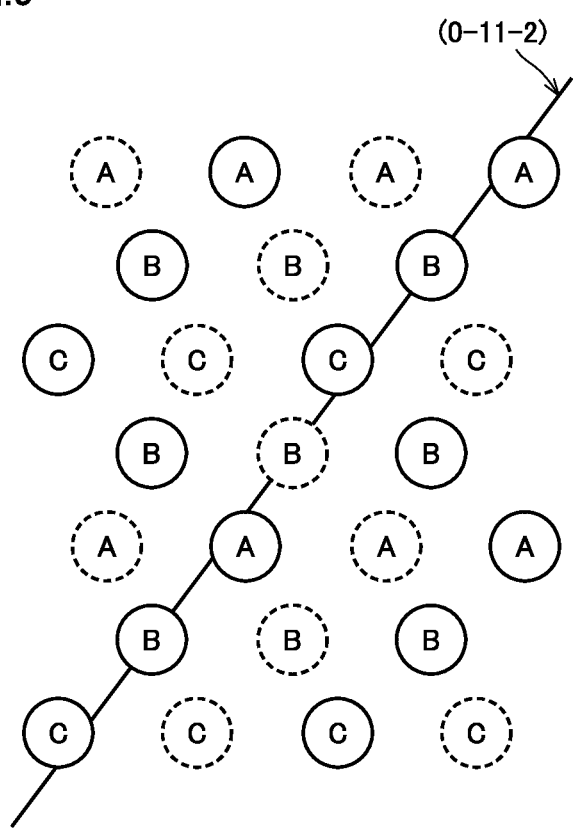
FIG. 9 a diagram showing crystal structure at a (11-20) plane along the line XXV-XXV in FIG. 8.

As shown in FIG. 9, at a (11-20) plane (a cross-section along the line IX-IX in FIG. 8), atoms in each layer of four layers of ABCB forming one period described above are not aligned to completely extend along a (0-11-2) plane. FIG. 9 shows the (0-11-2) plane as it passes through positions of atoms in the B layer, and in this case, it can be seen that atoms in each of the A layer and the C layer are displaced from the (0-11-2) plane. Therefore, even though a macroscopic plane orientation of a surface of silicon carbide single crystal, that is, a plane orientation in a case where an atomic-level structure is ignored, is limited to (0-11-2), this surface can microscopically take various structures.

Figure 10:
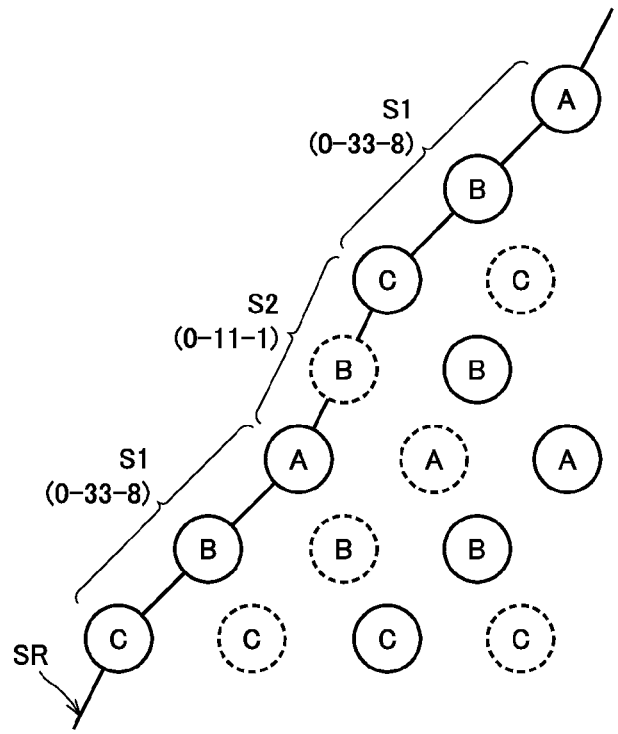
FIG. 10 is a diagram showing in a (11-20) plane, crystal structure in the vicinity of a surface of a combined surface in FIG. 7.

As shown in FIG. 10, combined surface SR is formed in such a manner that surface S1 having the plane orientation (0-33-8) and surface S2 connected to surface S1 and having a plane orientation different from the plane orientation of surface S1 are alternately provided. A length of each of surface S1 and surface S2 is twice as large as interatomic spacing of Si atoms (or C atoms). It is noted that a surface obtained by averaging surface S1 and surface S2 corresponds to the (0-11-2) plane (FIG. 9).

Figure 11:
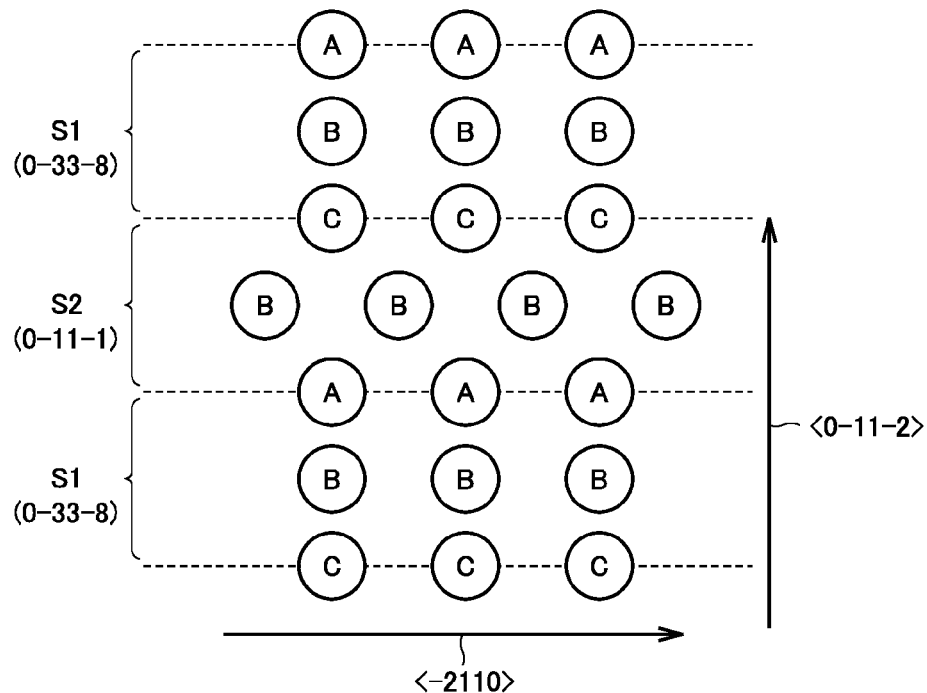
FIG. 11 is a diagram when the combined surface in FIG. 7 is viewed from a (01-10) plane.

As shown in FIG. 11, when combined surface SR is viewed from a (01-10) plane, single crystal structure periodically includes a structure equivalent to cubic crystal in part (a portion of surface S1). Specifically, combined surface SR is formed in such a manner that surface S1 having a plane orientation (001) in structure equivalent to the cubic crystal described above and surface S2 connected to surface S1 and having a plane orientation different from the plane orientation of surface S1 are alternately provided. Thus, it is also possible in a poly type other than 4H to form a surface from a surface having the plane orientation (001) in the structure equivalent to the cubic crystal (surface S1 in FIG. 7) and a surface connected to this surface and having a plane orientation different from this plane orientation (surface S2 in FIG. 7). The poly type may be, for example, 6H or 15R.

Figure 12:
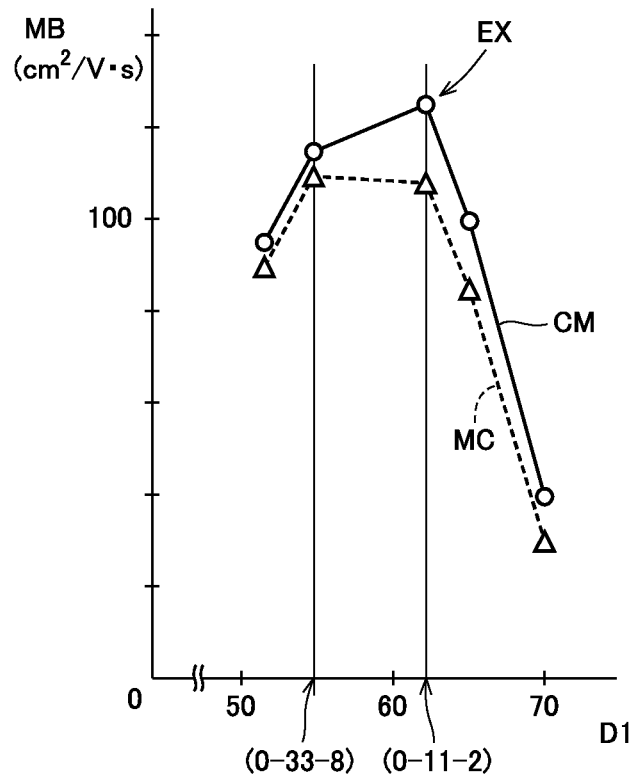
FIG. 12 is a graph showing one example of relation of a macroscopically viewed angle between a channel surface and a (000-1) plane with channel mobility, in each of a case where thermal etching is performed and a case where it is not performed.

Relation between a crystal plane of sidewall surface SW and mobility MB of a channel surface will now be described with reference to FIG. 12. In the graph in FIG. 12, the abscissa represents an angle D1 formed between a macroscopic plane orientation of sidewall surface SW having a channel surface and the (000-1) plane and the ordinate represents mobility MB. A plot group CM corresponds to a case where sidewall surface SW is finished as a special surface through thermal etching and a plot group MC corresponds to a case where such thermal etching is not performed.

Mobility MB in plot group MC was highest when a macroscopic plane orientation of the surface of the channel surface was set to (0-33-8). This may be because, in a case where thermal etching is not performed, that is, a microscopic structure of the channel surface is not particularly controlled, by setting a macroscopic plane orientation to (0-33-8), a ratio of formation of a microscopic plane orientation (0-33-8), that is, a plane orientation (0-33-8) in a case of considering even an atomic level was probabilistically high.

On the other hand, mobility MB in plot group CM was highest when a macroscopic plane orientation of the surface of the channel surface was set to (0-11-2) (an arrow EX). This may be because, as a large number of surfaces S1 each having the plane orientation (0-33-8) are regularly and densely arranged with surface S2 being interposed as shown in FIGS. 10 and 11, a ratio occupied by the microscopic plane orientation (0-33-8) was high at the surface of the channel surface.

Figure 13:
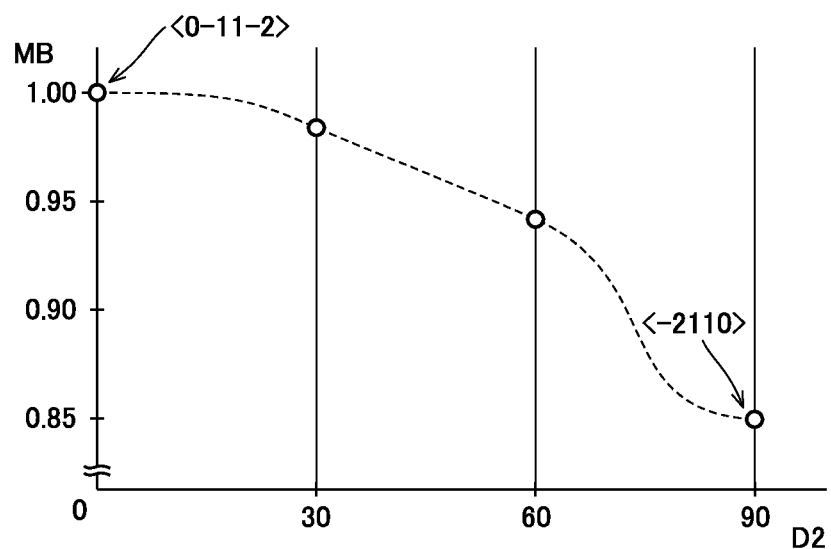
FIG. 13 is a graph showing one example of relation of an angle between a channel direction and a <0-11-2> direction with channel mobility.

It is noted that, on combined surface SR, mobility MB has orientation dependency. In the graph shown in FIG. 13, the abscissa represents an angle D2 between a channel direction and a <0-11-2> direction and the ordinate represents mobility MB (arbitrary unit) of the channel surface. A dashed line is supplementarily provided in order to facilitate viewing of the graph. It was found from this graph that, in order to increase channel mobility MB, angle D2 which channel direction CD (FIG. 7) has is preferably not smaller than 0° and not greater than 60° and more preferably substantially 0°.

Figure 14:
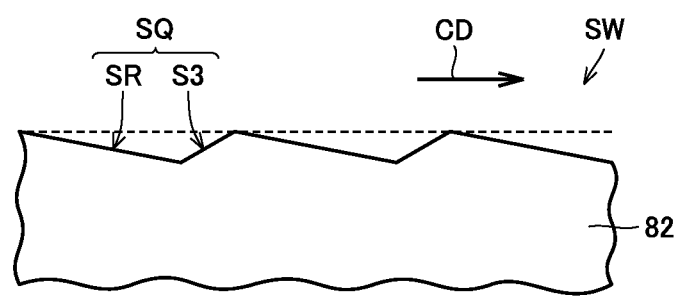
FIG. 14 is a diagram showing a variation of FIG. 7.

As shown in FIG. 14, sidewall surface SW may further include a surface S3 (a third surface) in addition to combined surface SR. More specifically, sidewall surface SW may include a combined surface SQ formed by periodic repetition of surface S3 and combined surface SR. In this case, an off angle of sidewall surface SW with respect to the {000-1} plane is deviated from 62° which is an ideal off angle of combined surface SR. This deviation is preferably small and preferably within a range of ±100. A surface included in such a range of angles is exemplified by a surface having a macroscopic plane orientation of a {0-33-8} plane. More preferably, an off angle of sidewall surface SW with respect to the (000-1) plane is deviated from 62° which is an ideal off angle of combined surface SR. This deviation is preferably small and preferably within a range of ±100. A surface included in such a range of angle is exemplified by a surface having a macroscopic plane orientation of a (0-33-8) plane.

Such a periodic structure can be observed, for example, with TEM or AFM.

A method of manufacturing MOSFET 1 (FIG. 1) representing a silicon carbide semiconductor device according to the present embodiment will now be described below.

Figure 15:
FIG. 15 is a partial cross-sectional view schematically showing a first step in a method for manufacturing a silicon carbide semiconductor device in a second example according to one embodiment of the present invention.

As shown in FIG. 15, lower drift layer 81a forming a part of n drift layer 81 (FIG. 1) is formed on silicon carbide single-crystal substrate 80. Specifically, lower drift layer 81a is formed through epitaxial growth on silicon carbide single-crystal substrate 80. This epitaxial growth can be achieved with CVD (Chemical Vapor Deposition) in which, for example, a gas mixture of silane ($SiH_4$) and propane ($C_3H_8$) is used as a source material gas, and, for example, a hydrogen gas ($H_2$) is used as a carrier gas. Here, for example, nitrogen (N) or phosphorus (P) is preferably introduced as an impurity.

Figure 16:
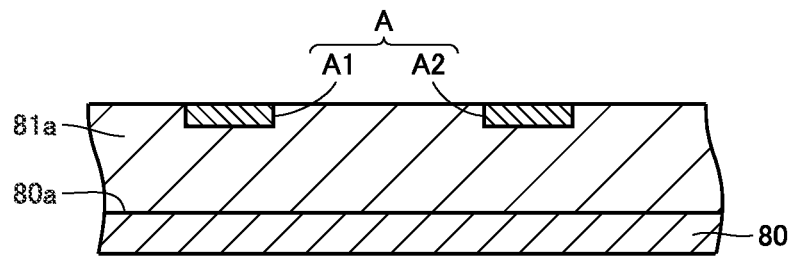
FIG. 16 is a partial cross-sectional view schematically showing a second step in the method for manufacturing a silicon carbide semiconductor device in the second example according to one embodiment of the present invention.

As shown in FIG. 16, p-type region A having the p-type is formed in a part of lower drift layer 81. Specifically, acceptor ions (impurity ions for providing the second conductivity type) are implanted into lower drift layer 81a with the use of an implantation mask (not shown).

Figure 17:
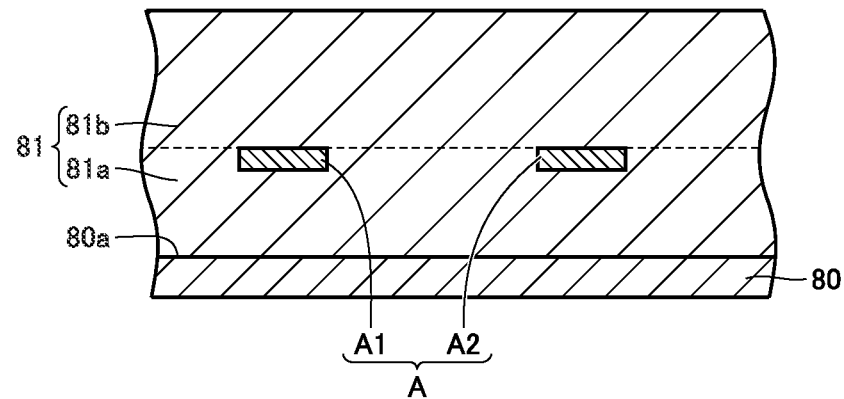
FIG. 17 is a partial cross-sectional view schematically showing a third step in the method for manufacturing a silicon carbide semiconductor device in the second example according to one embodiment of the present invention.

As shown in FIG. 17, after p-type region A is formed, upper drift layer 81b having the n-type is formed on lower drift layer 81a. Thus, p-type region A is embedded in n drift layer 81 formed from lower drift layer 81a and upper drift layer 81b. Upper drift layer 81b can be formed with a method the same as the method of forming lower drift layer 81a.

Figure 18:
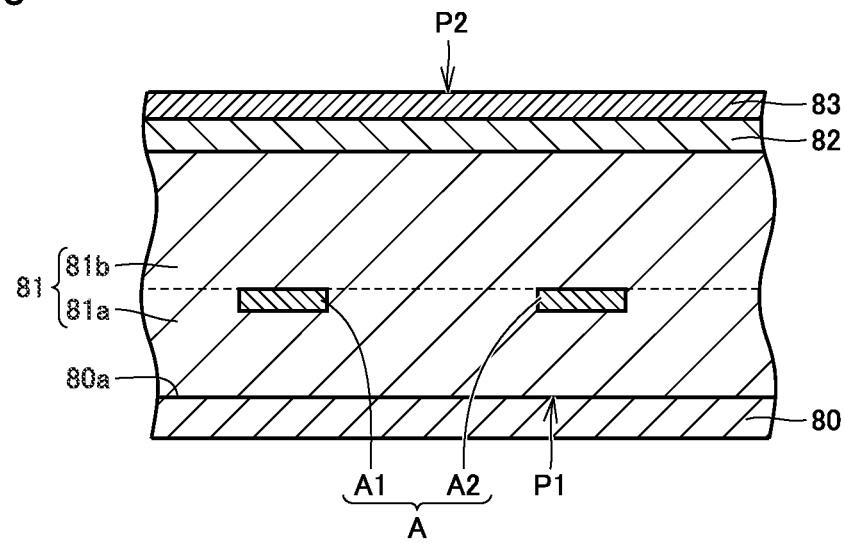
FIG. 18 is a partial cross-sectional view schematically showing a fourth step in the method for manufacturing a silicon carbide semiconductor device in the second example according to one embodiment of the present invention.
Figure 19:
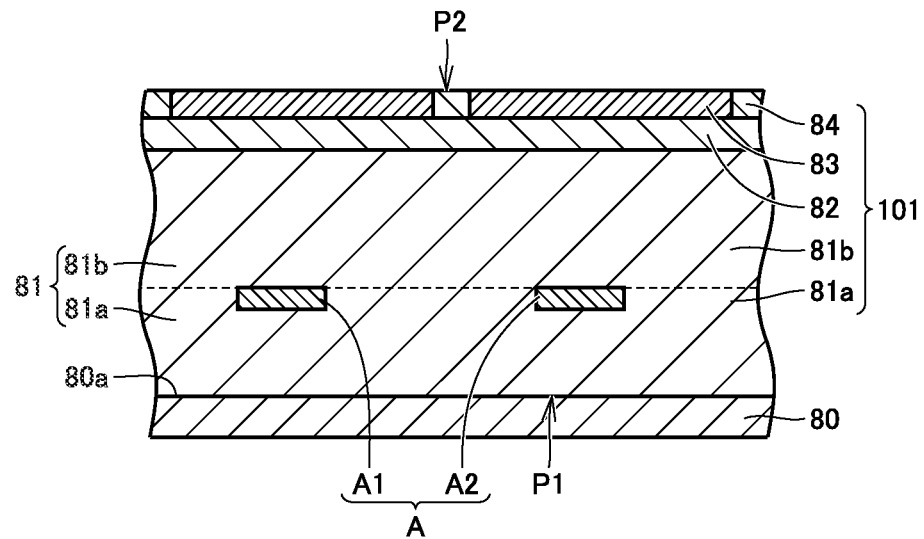
FIG. 19 is a partial cross-sectional view schematically showing a fifth step in the method for manufacturing a silicon carbide semiconductor device in the second example according to one embodiment of the present invention.

As shown in FIG. 18, p body layer 82 and n region 83 are formed on n drift layer 81. As shown in FIG. 19, p contact region 84 is formed on p body layer 82. Formation thereof can be achieved, for example, by ion implantation into n drift layer 81 (FIG. 18). In ion implantation for forming p body layer 82 and contact region 84, ions of an impurity for providing the p-type such as aluminum (Al) are implanted. Alternatively, in ion implantation for forming n region 83, ions of an impurity for providing the n-type such as phosphorus (P) are implanted. It is noted that epitaxial growth accompanying addition of an impurity instead of ion implantation may be employed.

N drift layer 81, p body layer 82, n region 83, p contact region 84, and p-type region A constitute epitaxial layer 101 having lower surface P1 and upper surface P2. N drift layer 81 forms lower surface P1 and n region 83 forms upper surface P2.

Then, heat treatment for activating an impurity is performed. A temperature for this heat treatment is preferably not lower than 1500° C. and not higher than 1900° C. and it is set, for example, to approximately 1700° C. A time period for heat treatment is set, for example, to approximately 30 minutes. An atmosphere for heat treatment is preferably an inert gas atmosphere, and for example, an Ar atmosphere is adopted.

Figure 20:
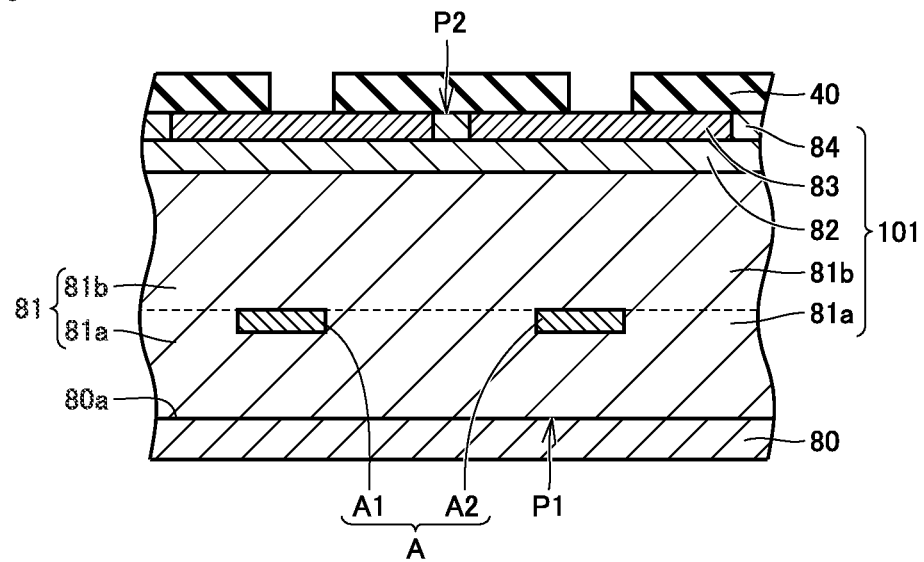
FIG. 20 is a partial cross-sectional view schematically showing a sixth step in the method for manufacturing a silicon carbide semiconductor device in the second example according to one embodiment of the present invention.

As shown in FIG. 20, a mask layer 40 having an opening is formed on a surface formed by n region 83 and p contact region 84. For example, a silicon oxide film or the like can be employed as mask layer 40. The opening is formed in correspondence with a position of trench TR (FIG. 1).

Figure 21:
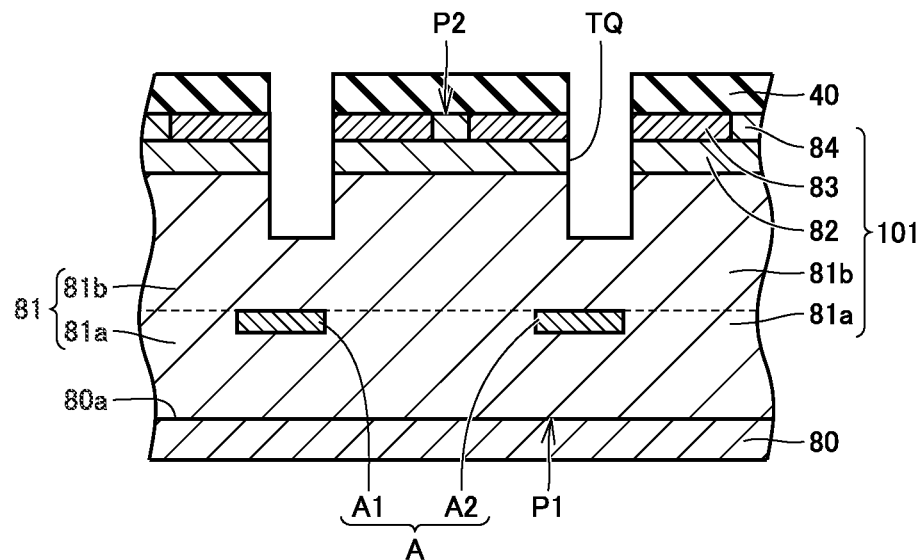
FIG. 21 is a partial cross-sectional view schematically showing a seventh step in the method for manufacturing a silicon carbide semiconductor device in the second example according to one embodiment of the present invention.

As shown in FIG. 21, in the opening in mask layer 40, n region 83, p body layer 82, and a part of n drift layer 81 are etched away. As an etching method, for example, reactive ion etching (RIE), in particular inductively coupled plasma (ICP) RIE, can be employed. Specifically, ICP-RIE using, for example, $SF_6$ or a gas mixture of $SF_6$ and $O_2$ as a reaction gas can be employed. Through such etching, a recess TQ having a sidewall substantially perpendicular to upper surface P2 is formed in a region where trench TR (FIG. 1) should be formed.

Then, thermal etching is performed in recess TQ. Thermal etching can be performed, for example, through heating in an atmosphere containing a reactive gas having at least one or more types of halogen atoms. At least one or more types of halogen atoms include at least any of chlorine (Cl) atoms and fluorine (F) atoms. This atmosphere is, for example, of $Cl_2$, $BCL_3$, $SF_6$, or $CF_4$. Thermal etching is performed in such a manner that, for example, a gas mixture of a chlorine gas and an oxygen gas is used as a reaction gas and a temperature for heat treatment, for example, not lower than 700° C. and not higher than 1000'C is set.

It is noted that the reaction gas may contain a carrier gas in addition to the chlorine gas and the oxygen gas described above. For example, a nitrogen ($N_2$) gas, an argon gas, a helium gas, or the like can be employed as a carrier gas.

Then, in a case where a temperature for heat treatment not lower than 700° C. and not higher than 1000° C. is set as described above, a rate of etching SiC attains, for example, to approximately 70 µm/hour. In addition, in this case, since mask layer 40 made of silicon oxide is extremely high in rate of selective etching of SiC, it is not substantially etched during etching of SiC.

Figure 22:
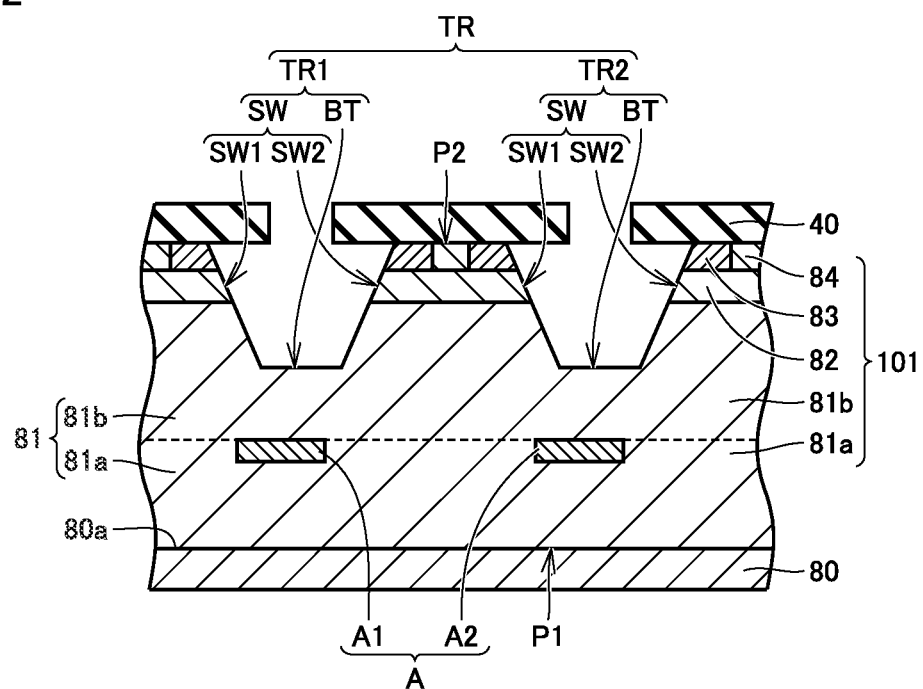
FIG. 22 is a partial cross-sectional view schematically showing an eighth step in the method for manufacturing a silicon carbide semiconductor device in the second example according to one embodiment of the present invention.

As shown in FIG. 22, through thermal etching above, trench TR is formed in upper surface P2 of epitaxial layer 101. Trench TR has sidewall surface SW passing through n region 83 and p body layer 82 to reach n drift layer 81 and bottom portion BT located on n drift layer 81. Each of sidewall surface SW and bottom portion BT is distant from p-type region A. Preferably, at the time of formation of trench TR, self-formation of a special surface on sidewall surface SW, in particular on p body layer 82, takes place. Then, mask layer 40 is removed with any method such as etching.

Figure 23:
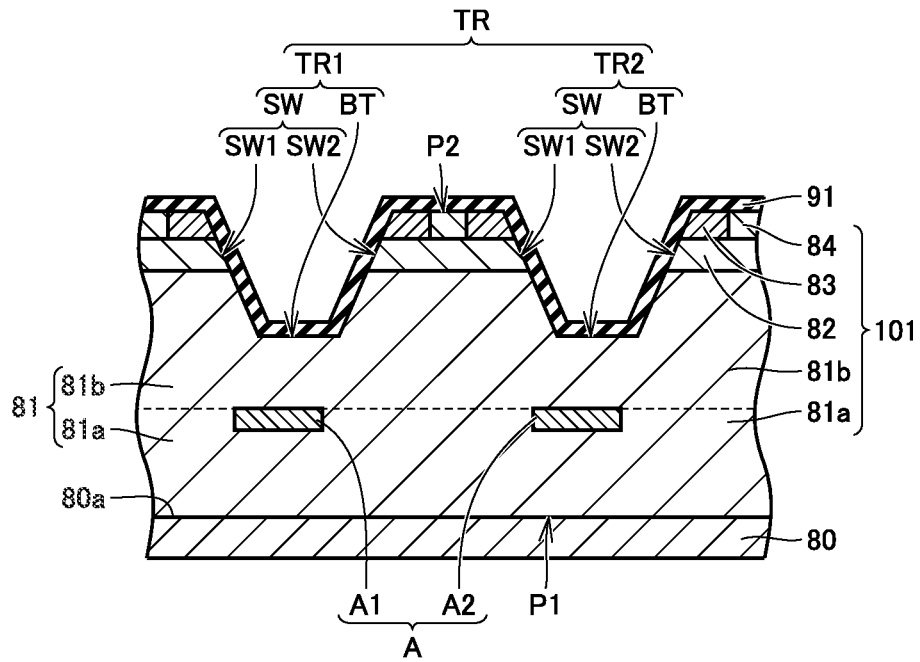
FIG. 23 is a partial cross-sectional view schematically showing a ninth step in the method for manufacturing a silicon carbide semiconductor device in the second example according to one embodiment of the present invention.

As shown in FIG. 23, gate insulating film 91 covering each of sidewall surface SW and bottom portion BT of trench TR is formed. Gate insulating film 91 can be formed, for example, through thermal oxidation. Thereafter, NO annealing using a nitrogen monoxide (NO) gas as an atmospheric gas may be performed. A temperature profile has a condition, for example, of a temperature not lower than 1100° C. and not higher than 1300° C. and a retention time period around 1 hour. Thus, nitrogen atoms are introduced in an interface region between gate insulating film 91 and p body layer 82. Consequently, formation of interface state at the interface region is suppressed, so that channel mobility can be improved. It is noted that, if such nitrogen atoms can be introduced, a gas other than the NO gas may be employed as an atmospheric gas. After this NO annealing, Ar annealing using argon (Ar) as an atmospheric gas may further be performed. A heating temperature in Ar annealing is preferably equal to or higher than a heating temperature in NO annealing above and lower than a melting point of gate insulating film 91. A time period during which this heating temperature is retained is set, for example, to approximately 1 hour. Thus, formation of interface state at the interface region between gate insulating film 91 and p body layer 82 is further suppressed. It is noted that other inert gases such as a nitrogen gas may be employed as an atmospheric gas instead of the Ar gas.

Figure 24:
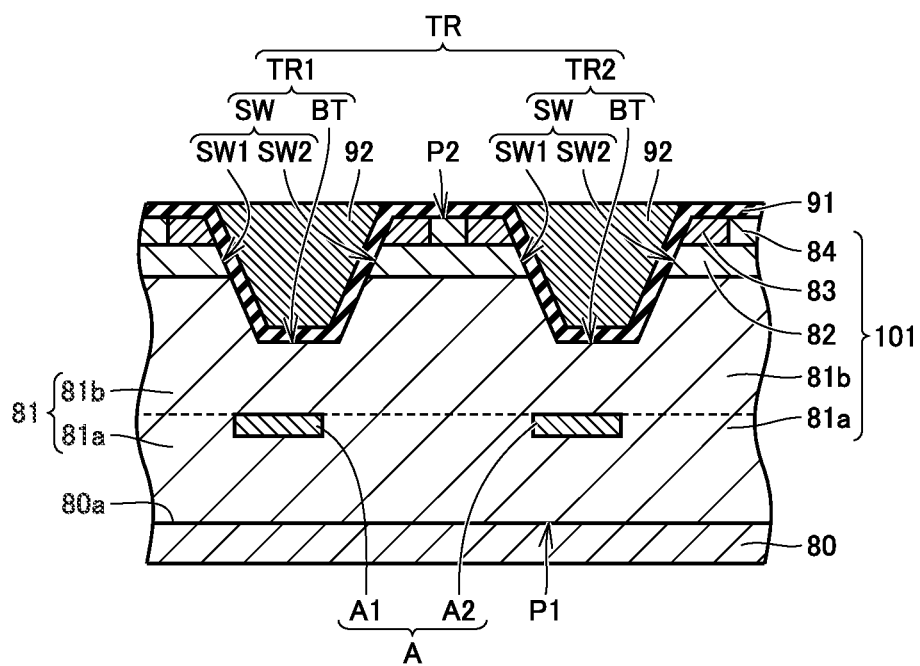
FIG. 24 is a partial cross-sectional view schematically showing a tenth step in the method for manufacturing a silicon carbide semiconductor device in the second example according to one embodiment of the present invention.

As shown in FIG. 24, gate electrode 92 is formed on gate insulating film 91. Specifically, gate electrode 92 is formed on gate insulating film 91 so as to bury a region inside trench TR with gate insulating film 91 being interposed. A method of forming gate electrode 92 can be performed, for example, by forming a film of a conductor or doped polysilicon and CMP (Chemical Mechanical Polishing).

Figure 25:
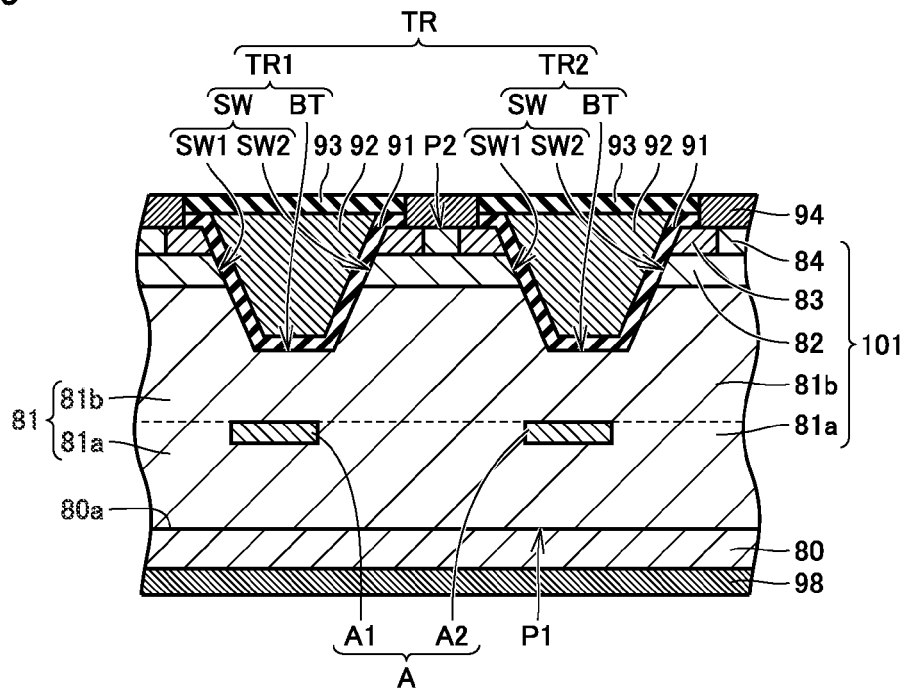
FIG. 25 is a partial cross-sectional view schematically showing an eleventh step in the method for manufacturing a silicon carbide semiconductor device in the second example according to one embodiment of the present invention.

Referring to FIG. 25, interlayer insulating film 93 is formed on gate electrode 92 and gate insulating film 91 so as to cover an exposed surface of gate electrode 92. Etching is performed to form an opening in interlayer insulating film 93 and gate insulating film 91. This opening exposes each of n region 83 and p contact region 84 at upper surface P2. Then, source electrode 94 in contact with each of n region 83 and n contact region 84 is formed on upper surface P2. Drain electrode 98 is formed on lower surface P formed from n drift layer 81, with silicon carbide single-crystal substrate 80 being interposed. Referring again to FIG. 1, source interconnection layer 95 is formed. Thus. MOSFET 1 is obtained.

(Regarding Relation Between Device Yield and Chip Size)

Figure 26:
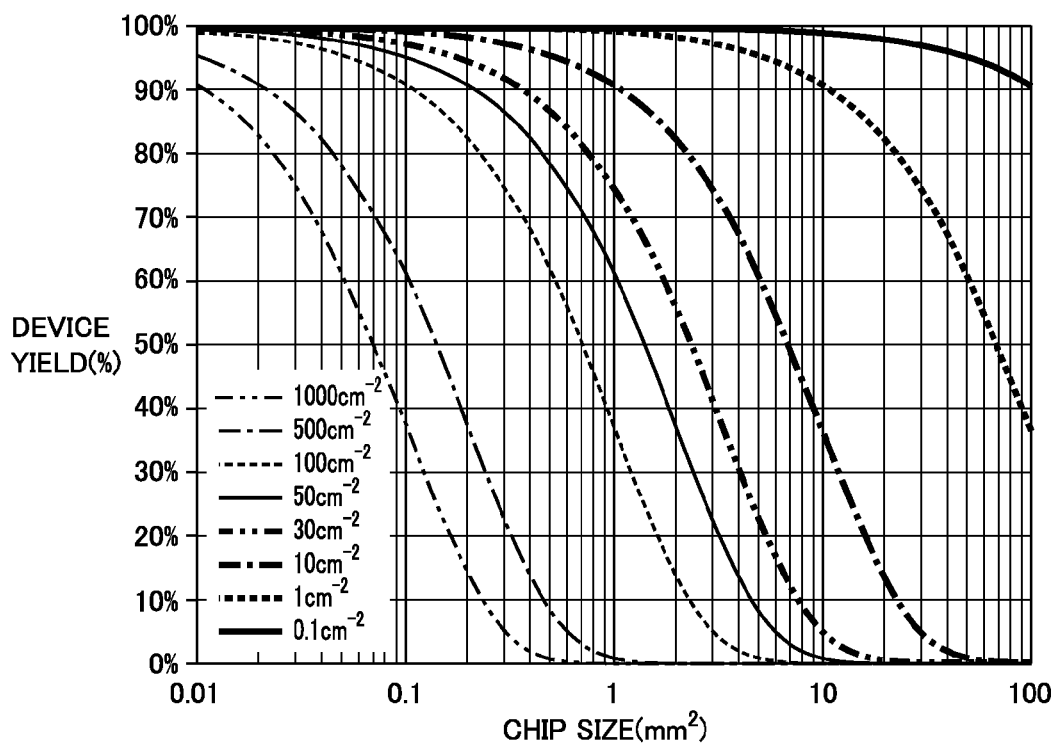
FIG. 26 is a diagram showing relation between a device yield and a chip size

Results of simulation of relation between a device yield and a chip size will be described with reference to FIG. 26. In the present simulation, relation between a device yield and a chip size was investigated under such conditions that a dislocation density of surface 80a of silicon carbide single-crystal substrate 80 was set, for example, to 0.1 cm$^{-2}$, 1 cm$^{-2}$, 10 cm$^{-2}$, 30 cm$^{-2}$, 50 cm$^{-2}$, 100 cm$^{-2}$, 500 cm$^{-2}$, and 1000 cm$^{-2}$. A device yield represents a probability of dislocation not reaching trench TR. A chip size represents a region of a chip where no p-type region is present. As shown in FIG. 26, with a dislocation density being the same, a greater chip size leads to a lower device yield. Based on comparison of device yields with the chip size being the same, a higher dislocation density leads to a lower device yield. A device yield is preferably not lower than approximately 40%.

For example, in a case that a chip of a MOSFET has an effective area of 10 mm$^2$, when it is assumed that an area of (gate) trench TR is approximately 20% of the effective area of the chip, an area of trench TR is approximately 2 mm$^2$. In order to obtain a device yield not lower than approximately 40% in a case that a dislocation density of surface 80a of silicon carbide single-crystal substrate 80 is 50 cm$^{-2}$, a region of the chip where no p-type region is present should be less than approximately 1.6 mm$^2$. In other words, a region of the chip where a p-type region is present should be not less than approximately 0.4 mm$^2$. Namely, a ratio calculated by dividing an area (0.4 mm$^2$) of the p-type region by an area (2 mm$^2$) of the trenches in a plan view should be not lower than approximately 20%.

(Regarding Relation of Impurity Concentration $N_d$ and Distance $L_d$ with Breakdown Voltage)

Figure 27:
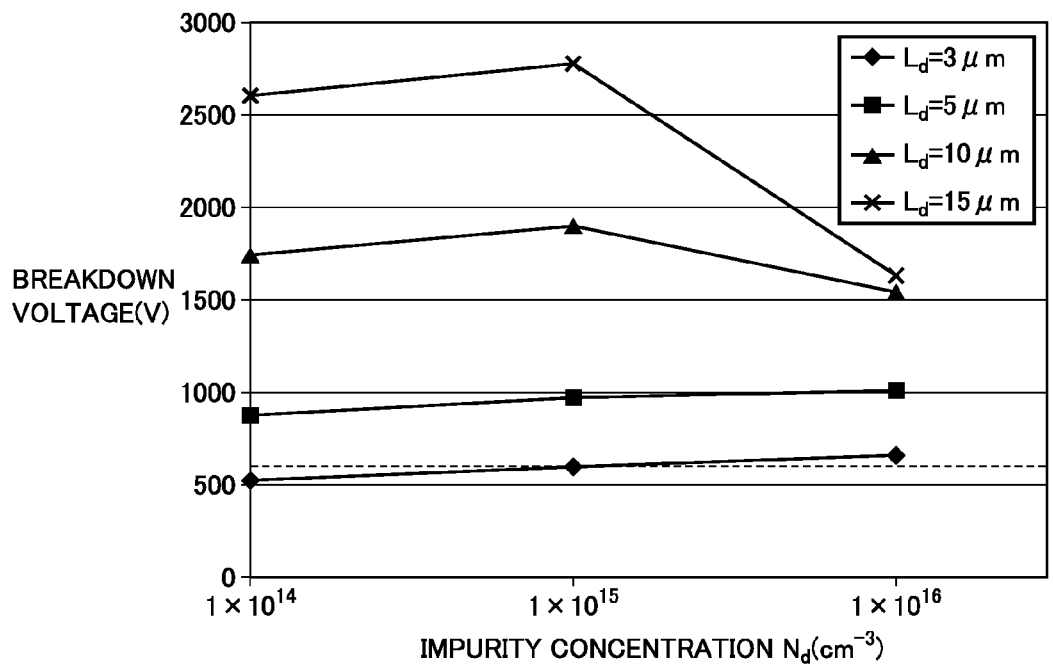
FIG. 27 is a graph exemplifying relation between impurity concentration $N_d$ in a drift layer and a breakdown voltage in each of cases where a distance $L_d$=3 µm, 5 µm, 10 µm, and 15 µm.

Relation of a breakdown voltage at an interface between a relaxing region and a lower drift layer with an impurity concentration in the lower drift layer will be described with reference to FIG. 27. As shown in results of simulation in FIG. 27, when an impurity dose amount in the relaxing region is high enough not to cause complete depletion of the relaxing region (for example, p-type region A in FIG. 1), a breakdown voltage at the interface between the relaxing region and the lower drift layer (for example, p-type region A and lower drift layer 81a in FIG. 1) is mainly determined by impurity concentration $N_d$ in the lower drift layer and distance $L_d$ between the relaxing region (p-type region A) and lower surface P1 (see, for example, FIG. 1). The upper limit of this breakdown voltage is around 600 V (see a dashed line in the figure) in a silicon semiconductor device. In a silicon carbide semiconductor device, a breakdown voltage not lower than 600 V was obtained in a case of $L_d \geq 5$ μm.

(Regarding Distance $L_{tr}$)

Figure 28:
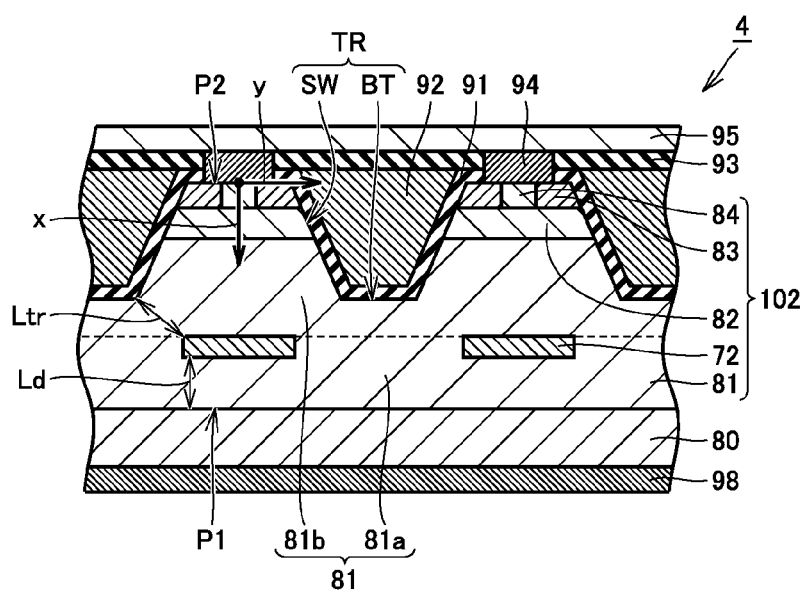
FIG. 28 is a partial cross-sectional view schematically showing a construction of a silicon carbide semiconductor device for calculating electric field intensity in FIG. 29.
Figure 29:
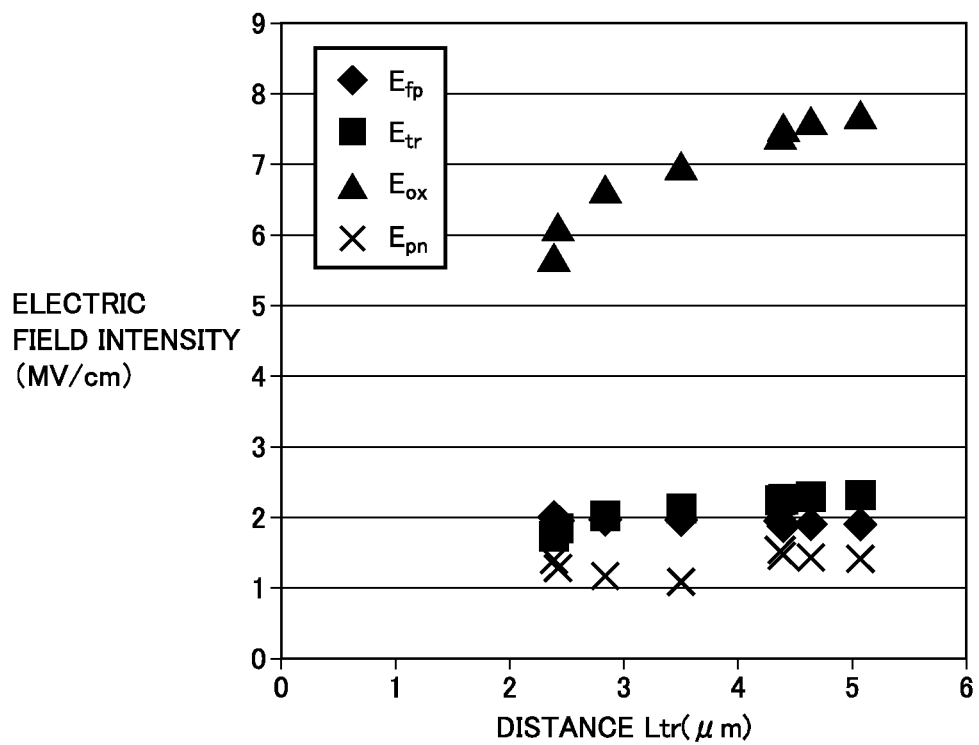
FIG. 29 is a diagram exemplifying relation of a distance $L_{tr}$ between a p-type region and a corner portion of the trench with each of electric field intensity $E_{fp}$ applied to an interface between a drift layer and a p-type region, electric field intensity $E_{tr}$ applied to the drift layer in the trench, electric field intensity $E_{ox}$ applied to a gate insulating film, and electric field intensity $E_{pn}$ applied to an interface between the drift layer and a body region.

FIG. 29 shows results of simulation of relation between distance $L_{tr}$ in a trench-structure MOSFET 4 (see FIG. 28) and each of electric field intensity $E_{fp}$ applied to the interface between lower drift layer 81a and p-type region A, electric field intensity $E_{tr}$ applied to upper drift layer 81b in trench TR, electric field intensity $E_{ox}$ applied to gate insulating film 91, and electric field intensity $E_{pn}$ applied to the interface between upper drift layer 81b and p body layer 82. Breakdown of gate insulating film 91 has been said to occur at electric field intensity $E_{ox}$=8 to 10 MV/cm, however, in order to reliably prevent breakdown, electric field intensity $E_{ox}$ is desirably not higher than 7 MV/cm. This demand was met when distance $L_{tr}$ was set to 4 μm or smaller.

It is noted that, referring to FIG. 28, in this simulation, such conditions as a coordinate of a trench corner portion in the xy coordinate system of (4.6 μm, 1.65 μm), an impurity concentration in lower drift layer 81a of 4.5×10$^{15}$ cm$^{-3}$, an impurity concentration in upper drift layer 81b of 7.5×10$^{15}$ cm$^{-3}$, and an impurity dose amount in p-type region A of 1.0×10$^{13}$ cm$^{-2}$ were employed. In first calculation for simulating a structure where distance $L_{tr}$ is relatively small, a thickness of lower drift layer 81a was set to 8 μm, a thickness of upper drift layer 81b was set to 4 μm, and ranges x of extension of p-type region A were set to x=0 to 2 μm (distance $L_{tr}$=3.5 μm), x=1 to 3 μm (distance $L_{tr}$=2.84 μm), x=2 to 4 μm (distance $L_{tr}$=2.43 μm), and x=3 to 5 μm (distance $L_{tr}$=2.38 μm). In second calculation for simulating a structure where distance $L_{tr}$ is relatively great, a thickness of lower drift layer 81a was set to 6 μm, a thickness of upper drift layer 81b was set to 6 μm, and ranges x of extension of p-type region A were set to x=0 to 2 μm (distance $L_{tr}$=5.07 μm), x=1 to 3 μm (distance $L_{tr}$=4.63 μm), x=2 to 4 μm (distance $L_{tr}$=4.39 μm), and x=3 to 5 μm (distance $L_{tr}$=4.37 μm).

Though a MOSFET has been described as a silicon carbide semiconductor device by way of example in the present embodiment, the silicon carbide semiconductor device may be an insulated gate bipolar transistor (IGBT). Though the present embodiment has been described with the n-type being defined as the first conductivity type and the p-type being defined as the second conductivity type, the p-type may be defined as the first conductivity type and the n-type may be defined as the second conductivity type.

A function and effect of MOSFET 1 as the silicon carbide semiconductor device according to the present embodiment will now be described.

According to MOSFET 1 in the present embodiment, in a cross-sectional view, p-type region A is arranged to intersect with the line which passes through any of first corner portion C1 and second corner portion C2 and is in parallel to the <0001> direction of the silicon carbide crystal forming silicon carbide layer 101. Thus, electric field in first corner portion C1 or second corner portion C2 of trench TR can effectively be relaxed. Consequently, lowering in breakdown voltage of MOSFET 1 can be suppressed. Since a ratio calculated by dividing total area SP of p-type regions A by total area ST of trenches TR is not lower than 20%, lowering in breakdown voltage of MOSFET 1 due to influence by dislocation can be suppressed. Furthermore, when a ratio calculated by dividing total area SP of p-type regions A by total area ST of trenches TR is not greater than 130%, excessive blocking of a current which flows between the source and the drain can be suppressed, and hence increase in ON resistance of the MOSFET can be suppressed.

In MOSFET 1 according to the present embodiment, distance $L_{tr}$ between p-type region A and bottom portion BT of trench TR is not greater than 4 μm. Thus, electric field concentration in gate insulating film 91 at bottom portion BT of trench TR can more effectively be suppressed. Therefore, lowering in breakdown voltage of MOSFET 1 can effectively be suppressed.

In MOSFET 1 according to the present embodiment, distance $L_d$ between p-type region A and first main surface P1 is not smaller than 5 μm. Thus, a depletion layer having a length of 5 μm at the maximum can be formed between p-type region A and first main surface P1. In other words, a depletion layer having a sufficient length can more reliably be formed between p-type region A and first main surface P1. Therefore, lowering in breakdown voltage of MOSFET 1 can effectively be suppressed.

MOSFET 1 according to the embodiment further includes silicon carbide single-crystal substrate 80 in contact with first main surface P1. Thus, MOSFET 1 having silicon carbide single-crystal substrate 80 can be obtained.

In MOSFET 1 according to present embodiment, a dislocation density of surface 80a of silicon carbide single-crystal substrate 80 in contact with first main surface P1 is not less than 50/cm$^2$ and not more than 5000/cm$^2$. When a dislocation density of surface 80a in contact with first main surface P1 is in a range not less than 50/cm$^2$ and not more than 5000/cm$^2$, lowering in breakdown voltage of MOSFET 1 can more effectively be suppressed.

In MOSFET 1 according to the present embodiment, surface 80a of silicon carbide single-crystal substrate 80 in contact with first main surface P1 has an off angle not smaller than 2° and not greater than 8° with respect to a {000-1} plane. Since surface 80a in contact with first main surface P1 has an off angle not smaller than 2° and not greater than 8° with respect to the {000-1} plane, lowering in breakdown voltage of MOSFET 1 can more effectively be suppressed.

In MOSFET 1 according to the present embodiment, on sidewall surface SW of trench TR, second layer 82 is provided with surface SW including first surface S1 having a plane orientation {0-33-8}. Thus, a channel resistance at sidewall surface SW can be lowered. Therefore, an ON resistance of the MOSFET can be lowered.

In MOSFET 1 according to the present embodiment, surface SW microscopically includes first surface S1 and surface SW microscopically further includes second surface S2 having a plane orientation {0-11-1}. Thus, a channel resistance at sidewall surface SW can be lowered. Therefore, an ON resistance of MOSFET 1 can be lowered.

In MOSFET 1 according to the present embodiment, the first and second surfaces of surface SW form combined surface SR having a plane orientation {0-11-2}. Thus, a channel resistance at sidewall surface SW can be lowered. Therefore, an ON resistance of MOSFET 1 can be lowered.

In MOSFET 1 according to the present embodiment, surface SW has an off angle of 62°±10° macroscopically with respect to a {000-1} plane. Thus, a channel resistance at sidewall surface SW can be lowered. Therefore, an ON resistance of MOSFET 1 can be lowered.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1, 2, and 4 silicon carbide semiconductor device (MOSFET); 40 mask layer; 80 silicon carbide single-crystal substrate, 81 first layer (drift layer); 81a lower drift layer; 81b upper drift layer; 82 second layer (p body layer); 83 third layer (n region); 84 contact region; 91 gate insulating film; 92 gate electrode; 93 interlayer insulating film; 94 source electrode; 95 source interconnection layer; 98 drain electrode; 101 silicon carbide layer (epitaxial layer); A second-conductivity-type region (p-type region); B boundary surface; BT bottom portion; C corner portion; C1a, C2a point of contact; C1 first corner portion; C2 second corner portion; CD channel direction; P1 first main surface (lower surface); P2 second main surface (upper surface); S1 first surface; S2 second surface; SQ, SR combined surface, SW sidewall surface (surface); SW1 first sidewall surface; SW2 second sidewall surface; SW3 third sidewall surface; SW4 fourth sidewall surface; TQ recess; TR trench; TR1 first trench portion; and TR2 second trench portion.

The invention claimed is:

1. A silicon carbide semiconductor device, comprising:
a silicon carbide layer having a first main surface and a second main surface opposite to said first main surface, said silicon carbide layer including
  a first layer forming said first main surface and having a first conductivity type,
  a second layer provided on said first layer and having a second conductivity type different from said first conductivity type, and
  a third layer provided on said second layer to be spaced apart from said first layer, forming said second main surface, and having said first conductivity type,
said second main surface of said silicon carbide layer being provided with one or more trenches,
said one or more trenches having a sidewall surface passing through said third layer and said second layer to reach said first layer and a bottom portion located in said first layer,
said sidewall surface having a first sidewall surface and a second sidewall surface which are opposed to each other in a cross-sectional view,
said one or more trenches further having, in a cross-sectional view, a first corner portion which is an intersection between said first sidewall surface and said bottom portion and a second corner portion which is an intersection between said second sidewall surface and said bottom portion,
said first layer having one or more second-conductivity-type regions located on a side of said first main surface relative to said bottom portion and having said second conductivity type,
in a cross-sectional view, said one or more second-conductivity-type regions being arranged to intersect with a line which passes through any of said first corner portion of said one or more trenches and said second corner portion of said one or more trenches and is in parallel to a <0001> direction of a silicon carbide crystal forming said silicon carbide layer, and
a ratio calculated by dividing SP by ST being not lower than 20% and not higher than 130%, where ST represents a total area of said one or more trenches in a boundary surface between said first layer and said second layer and SP represents a total area of said one or more second-conductivity-type regions in a plan view,
wherein said one or more second-conductivity-type regions being distant from said bottom portion, below said first corner portion, and below said second corner portion of one of said one or more trenches.

2. The silicon carbide semiconductor device according to claim 1, wherein
a distance between said one or more second-conductivity-type regions and said bottom portion of said one or more trenches is not greater than 4 μm.

3. The silicon carbide semiconductor device according to claim 1, wherein
a distance between said one or more second-conductivity-type regions and said first main surface is not smaller than 5 μm.

4. The silicon carbide semiconductor device according to claim 1, further comprising a silicon carbide single-crystal substrate in contact with said first main surface.

5. The silicon carbide semiconductor device according to claim 4, wherein
a dislocation density of a surface of said silicon carbide single-crystal substrate in contact with said first main surface is not less than 50/cm' and not more than 5000/cm$^2$.

6. The silicon carbide semiconductor device according to claim 4, wherein
a surface of said silicon carbide single-crystal substrate in contact with said first main surface has an off angle not smaller than 2° and not greater than 8° with respect to a {000-1} plane.

7. The silicon carbide semiconductor device according to claim 1, wherein
on said sidewall surface of said one or more trenches, said second layer is provided with a surface having a first surface having a plane orientation {0-33-8}.

8. The silicon carbide semiconductor device according to claim 7, wherein
said surface microscopically includes said first surface and said surface microscopically further includes a second surface having a plane orientation {0-11-1}.

9. The silicon carbide semiconductor device according to claim 8, wherein
said first and second surfaces of said surface form a combined surface having a plane orientation {0-11-2}.

10. The silicon carbide semiconductor device according to claim 9, wherein
said surface has an off angle of 62°±10° macroscopically with respect to a {000-1} plane.

* * * * *

UNITED STATES PATENT AND TRADEMARK OFFICE
CERTIFICATE OF CORRECTION

| | |
|---|---|
| PATENT NO. | : 9,490,319 B2 |
| APPLICATION NO. | : 14/764954 |
| DATED | : November 8, 2016 |
| INVENTOR(S) | : Keiji Wada et al. |

It is certified that error appears in the above-identified patent and that said Letters Patent is hereby corrected as shown below:

In the Claims

In Claim 5, Column 19, Lines 5-6, replace "surface is not less than $50/cm^1$ and not more than $5000/cm^2$" with -- surface is not less than $50/cm^2$ and not more than $5000/cm^2$ --

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*